(12) United States Patent
Fukushima et al.

(10) Patent No.: US 10,896,913 B2
(45) Date of Patent: Jan. 19, 2021

(54) SEMICONDUCTOR MEMORY DEVICE INCLUDING MEMORY PILLARS AND TRANSISTOR AND MANUFACTURING METHOD THEREOF

(71) Applicant: Toshiba Memory Corporation, Minato-ku (JP)

(72) Inventors: Takashi Fukushima, Yokkaichi (JP); Junya Fujita, Nagoya (JP); Toshiharu Nagumo, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/298,029

(22) Filed: Mar. 11, 2019

(65) Prior Publication Data
US 2020/0083243 A1 Mar. 12, 2020

(30) Foreign Application Priority Data
Sep. 6, 2018 (JP) .................................. 2018-166834

(51) Int. Cl.
*H01L 27/11573* (2017.01)
*H01L 27/11565* (2017.01)
*H01L 27/11578* (2017.01)
*H01L 27/1157* (2017.01)
*H01L 21/28* (2006.01)

(52) U.S. Cl.
CPC .... *H01L 27/11573* (2013.01); *H01L 27/1157* (2013.01); *H01L 27/11565* (2013.01); *H01L 27/11578* (2013.01); *H01L 29/40117* (2019.08)

(58) Field of Classification Search
CPC ......... H01L 27/11573; H01L 29/40117; H01L 27/11565; H01L 27/11578; H01L 27/1157; H01L 27/11582; H01L 27/11556; H01L 27/11526
USPC ......................................................... 257/324
See application file for complete search history.

(56) References Cited

U.S. PATENT DOCUMENTS 7,683,404 B2 * 3/2010 Jang ...................... H01L 27/105
257/211
8,378,409 B2 * 2/2013 Park .................. H01L 27/11582
257/316

(Continued)

FOREIGN PATENT DOCUMENTS

| JP | 2008-78404 | 4/2008 |
| JP | 2011-49395 | 3/2011 |
| JP | 2011-49561 | 3/2011 |

*Primary Examiner* — Mohammad M Hoque
(74) *Attorney, Agent, or Firm* — Oblon, McClelland, Maier & Neustadt, L.L.P.

(57) ABSTRACT

According to an embodiment, a semiconductor memory device includes a semiconductor substrate. The semiconductor substrate includes a first surface. A first semiconductor layer is provided on a first region of the first surface. A first transistor is provided on the first semiconductor layer. A second semiconductor layer is provided on a second region of the first surface. A second transistor is provided on the second semiconductor layer. A stacked body is provided on a third region of the first surface. The stacked body includes a plurality of conductors and a plurality of memory pillars. A first insulator is provided between the first semiconductor layer and the second semiconductor layer.

10 Claims, 29 Drawing Sheets

(56) References Cited

U.S. PATENT DOCUMENTS

| | | | |
|---|---|---|---|
| 8,736,069 B2* | 5/2014 | Chiu | H01L 21/76838 |
| | | | 257/774 |
| 9,024,289 B2* | 5/2015 | Rho | H01L 27/2436 |
| | | | 257/5 |
| 9,099,566 B2* | 8/2015 | Kwon | H01L 21/8239 |
| 9,305,934 B1* | 4/2016 | Ding | H01L 27/11573 |
| 9,543,318 B1* | 1/2017 | Lu | H01L 27/11565 |
| 2008/0073635 A1 | 3/2008 | Kiyotoshi et al. | |
| 2010/0254191 A1* | 10/2010 | Son | H01L 27/11578 |
| | | | 365/185.05 |
| 2011/0049611 A1 | 3/2011 | Kiyotoshi et al. | |
| 2013/0017629 A1* | 1/2013 | Pyo | H01L 27/11551 |
| | | | 438/16 |
| 2014/0061849 A1* | 3/2014 | Tanzawa | H01L 27/108 |
| | | | 257/499 |
| 2016/0064041 A1* | 3/2016 | Okada | H01L 27/11573 |
| | | | 365/51 |
| 2018/0358372 A1* | 12/2018 | Hwang | H01L 27/11575 |

* cited by examiner

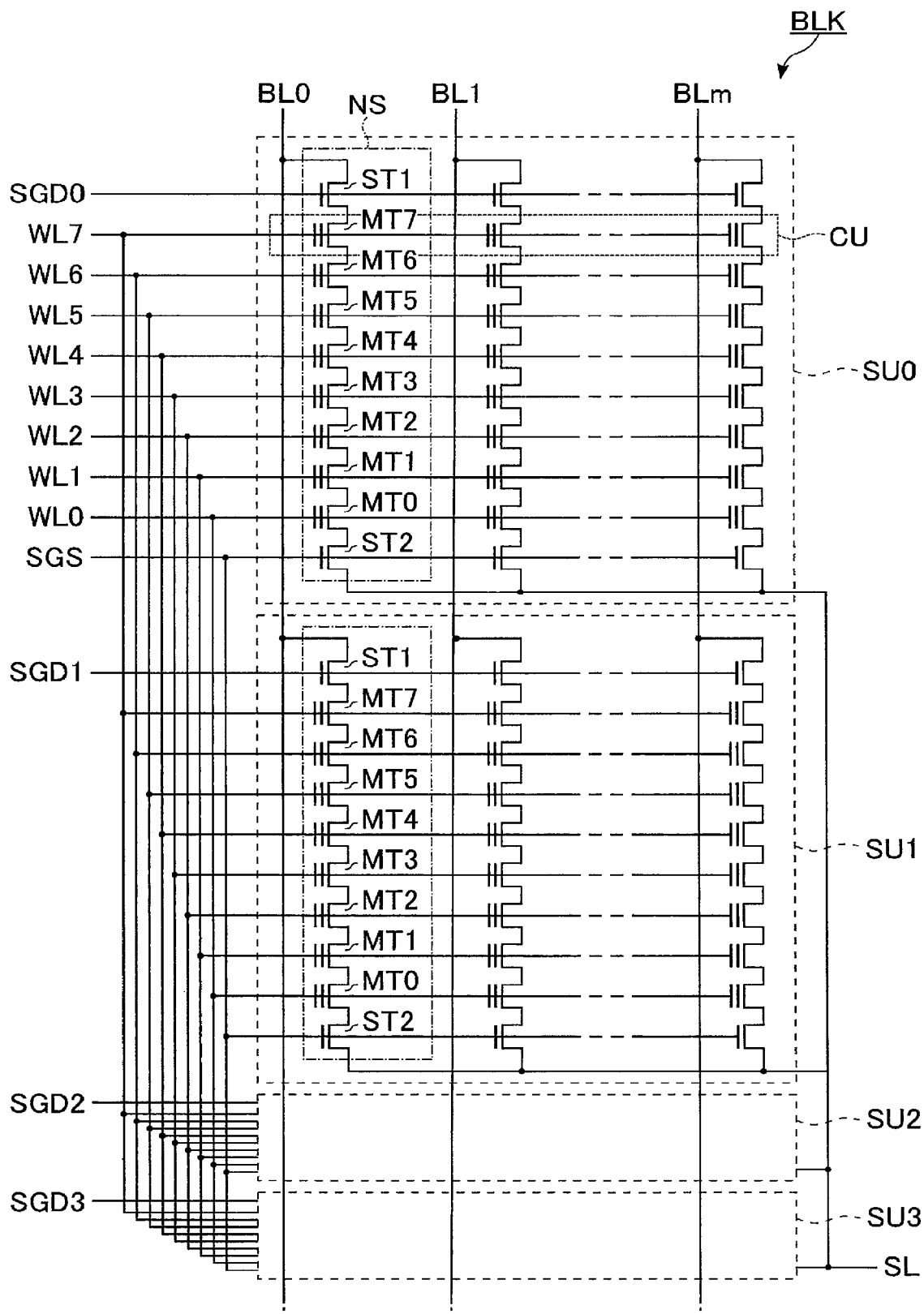
F I G. 2

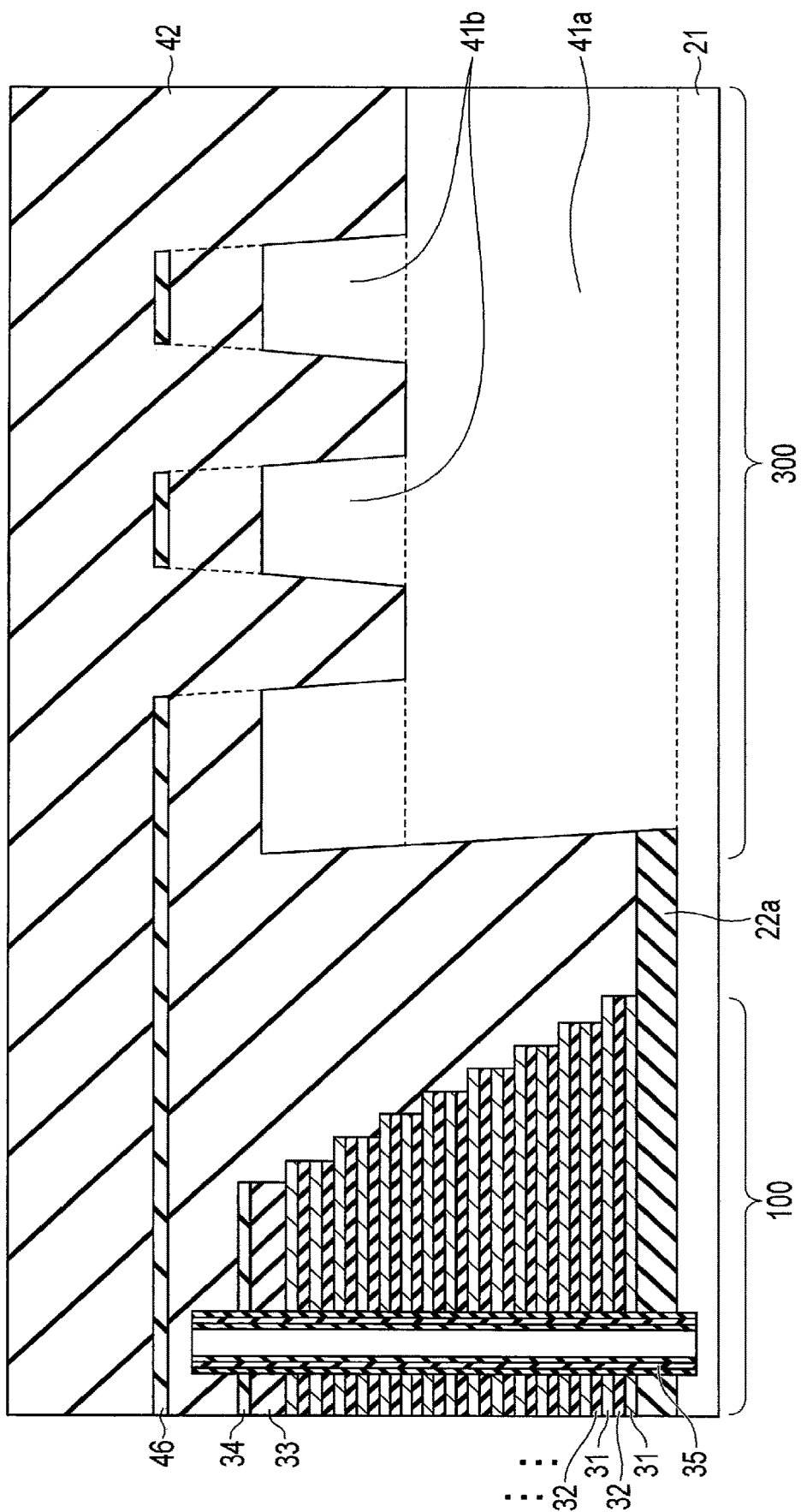
F I G. 26

SEMICONDUCTOR MEMORY DEVICE INCLUDING MEMORY PILLARS AND TRANSISTOR AND MANUFACTURING METHOD THEREOF

CROSS-REFERENCE TO RELATED APPLICATIONS

This application is based upon and claims the benefit of priority from Japanese Patent Application No. 2018-166834, filed Sep. 6, 2018, the entire contents of which are incorporated herein by reference.

FIELD

Embodiments described herein relate generally to a semiconductor storage device.

BACKGROUND

A NAND flash memory, in which memory cells are three-dimensionally arranged, has been known.

BRIEF DESCRIPTION OF THE DRAWINGS

FIG. 2 is a block diagram showing an example circuit configuration of a memory cell array in the semiconductor storage device according to the first embodiment.

FIGS. 21 to 27 are cross-sectional views showing sequential steps of an example manufacturing process of the semiconductor storage device according to the second embodiment.

DETAILED DESCRIPTION

Figure 1:
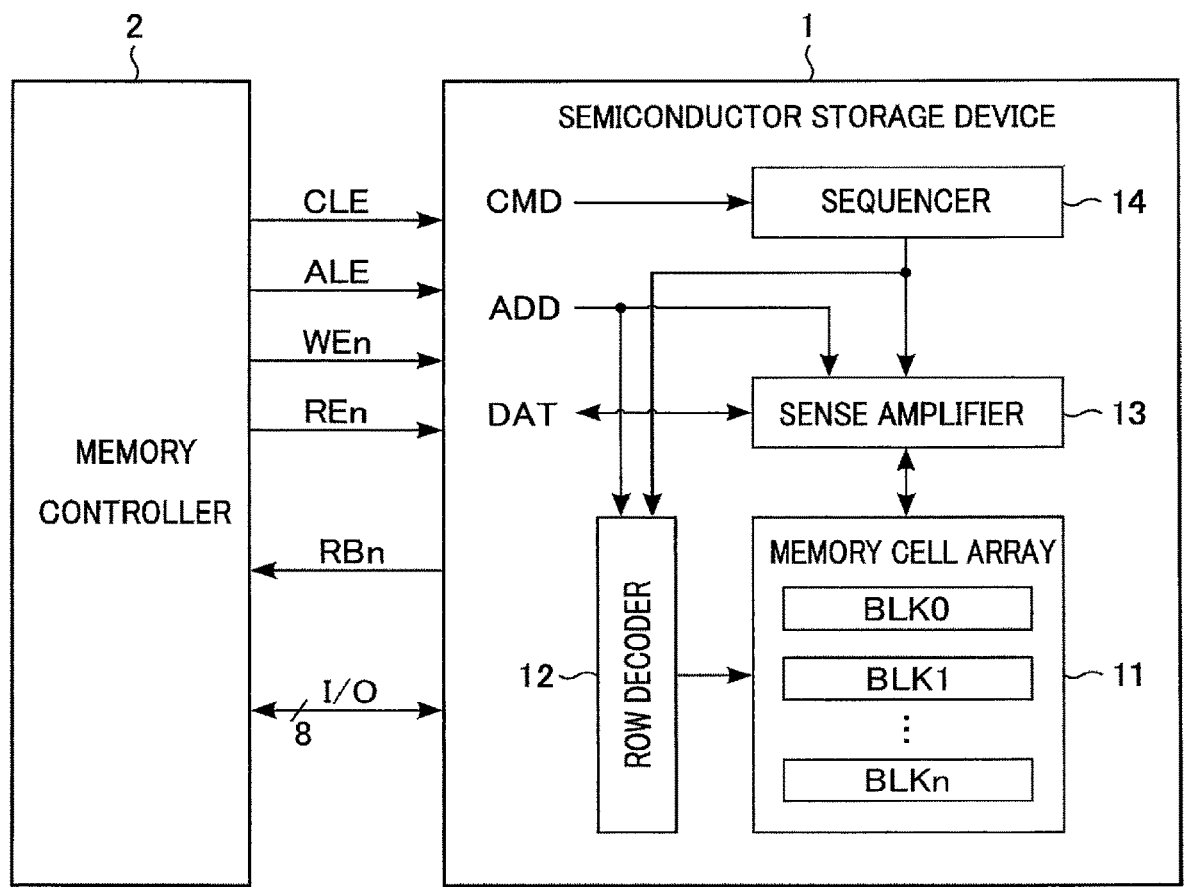
FIG. 1 is a block diagram showing an example of an overall configuration of a semiconductor storage device according to a first embodiment.

Generally, according to an embodiment, a semiconductor memory device includes a semiconductor substrate, a first semiconductor layer, a first transistor, a second semiconductor layer, a second transistor, and a stacked body. The semiconductor substrate includes a first surface. The first semiconductor layer is provided on a first region of the first surface of the semiconductor substrate. The first semiconductor layer includes a second surface opposite of and parallel to the first surface of the semiconductor substrate. The first transistor is provided on the second surface of the first semiconductor layer. The second semiconductor layer is provided on a second region of the first surface of the semiconductor substrate. The second semiconductor layer includes a third surface opposite of and parallel to the first surface of the semiconductor substrate. The second transistor is provided on the third surface of the second semiconductor layer. The stacked body is provided on a third region of the first surface of the semiconductor substrate. The stacked body includes a plurality of conductors that are stacked one above the other in a first direction and a plurality of memory pillars extending in the first direction. A first insulator is provided between the first semiconductor layer and the second semiconductor layer. A second insulator is provided between the first semiconductor layer and the stacked body. A third insulator is provided between the second semiconductor layer and the stacked body.

The embodiments will be explained below by referring to the drawings. The embodiments exemplify the device and method that realize the technical concept of the invention. The drawings are provided merely for a schematic or conceptual purpose, and thus may not be identical to a concrete form in dimensions or proportions. Furthermore, the technical concept of the invention is not limited by the form, structure, arrangement or the like of the structural components. In the following explanation, components having the same functions and structures will be referred to by the same reference numerals.

First Embodiment

A semiconductor storage device (semiconductor memory device) 1 according to the first embodiment will be discussed below.

[Example Structure]

(1) Overall Configuration of Semiconductor Storage Device

FIG. 1 shows an example of the overall configuration of the semiconductor storage device 1 according to the first embodiment. The semiconductor storage device 1 according to the first embodiment may be a NAND flash memory that is controlled by an externally provided memory controller 2 and is capable of storing data in a nonvolatile manner.

As illustrated in FIG. 1, the semiconductor storage device 1 may include a memory cell array 11 and peripheral circuitry. The peripheral circuitry may include a row decoder 12, a sense amplifier 13, and a sequencer 14.

The memory cell array 11 includes a plurality of blocks BLK0 to BLKn (where n is an integer larger than or equal to 1). A block BLK includes a plurality of nonvolatile memory cells and may serve as a unit of data erasure. The memory cell array 11 is provided with a plurality of bit lines and word lines. Each memory cell is associated with one bit line and one word line.

The row decoder 12 selects a block BLK in accordance with address information ADD that the semiconductor storage device 1 receives from the memory controller 2. Thereafter, the row decoder 12 applies specific voltages individually to the selected word line and unselected word lines.

In a write operation, the sense amplifier 13 holds write data DAT that the semiconductor storage device 1 receives from the memory controller 2, and applies specific voltages to the bit lines based on this write data DAT. In a read operation, the sense amplifier 13 determines data stored in memory cells based on the voltages of the bit lines, and outputs read data DAT to the memory controller 2, based on the determination result.

The sequencer 14 controls the entire operation of the semiconductor storage device 1 based on a command CMD that the semiconductor storage device 1 receives from the memory controller 2. The communications between the semiconductor storage device 1 and the memory controller 2 may support the NAND interface standard. For example, the communications between the semiconductor storage device 1 and the memory controller 2 may adopt a command latch enable signal CLE, an address latch enable signal ALE, a write enable signal WEn, a read enable signal REn, a ready busy signal RBn, and an input/output signal I/O. The input/output signal I/O may be an 8-bit signal, which may include a command CMD, address information ADD, and data DAT.

The command latch enable signal CLE indicates that the input/output signal I/O received by the semiconductor storage device 1 is a command CMD. The address latch enable signal ALE indicates that the input/output signal I/O received by the semiconductor storage device 1 is address information ADD. The write enable signal WEn instructs the semiconductor storage device 1 to input input/output signals I/O. The read enable signal REn instructs the semiconductor storage device 1 to output input/output signals I/O. The ready busy signal RBn notifies the memory controller 2 that the semiconductor storage device 1 is in a ready state of being ready to receive a command from the memory controller 2 or in a busy state of being unready to receive any command.

The above mentioned semiconductor storage device 1 and memory controller 2 may be combined into a single semiconductor storage device. Examples of such semiconductor storage devices include a memory card such as SD™ card, and a solid state drive (SSD).

(2) Memory Cell Array of Semiconductor Storage Device

As an example circuitry configuration of the memory cell array 11 in FIG. 1, FIG. 2 shows the circuitry configuration of one of the blocks BLK of the memory cell array 11.

A block BLK may include, as illustrated in FIG. 2, four string units SU0 to SU3. Each string unit SU includes a plurality of NAND strings NS. Each NAND string NS is associated with a corresponding one of bit lines BL0 to BLm (where m is an integer larger than or equal to 1), and includes, for example, memory cell transistors MT0 to MT7 and selection transistors ST1 and ST2. Each memory cell transistor MT includes a control gate and a charge trap layer, and stores data in a nonvolatile manner. The selection transistors ST1 and ST2 are used for selection of a string unit SU in various operations.

In each of the NAND strings NS, the drain of the selection transistor ST1 is coupled to the corresponding bit line BL. The memory cell transistors MT0 to MT7 are coupled in series between the source of the selection transistor ST1 and the drain of the selection transistor ST2. The source of the selection transistor ST2 is coupled to a source line SL.

In one block BLK, the control gates of the respective memory cell transistors MT0 to MT7 in different NAND strings NS are commonly coupled to a corresponding one of the word lines WL0 to WL7. The gates of the selection transistors ST1 of all the NAND strings NS in each of the string units SU0 to SU3 are commonly coupled to one of selection gate lines SGD0 to SGD3 corresponding to the string units SU. The gates of the selection transistors ST2 in each of the NAND strings NS in the same block BLK are commonly coupled to the selection gate line SGS.

Each bit line BL commonly couples the drains of the selection transistors ST1 of the corresponding NAND strings NS in different string units SU, to each other. A set of word lines WL0 to WL7 is provided for each block BLK, while a source line SL is shared by different string units SU.

A group of memory cell transistors MT commonly coupled to a word line WL in one string unit SU may be referred to as a cell unit CU. For example, when each of the memory cell transistors MT in a cell unit CU stores therein 1-bit data, data corresponding to the storage capacity of this cell unit CU may be referred to as "1-page data".

The circuitry configuration of the memory cell array 11 has been described above, but it is not limited to the above configuration. For instance, the number of string units SU in a block BLK may be freely determined. In addition, the numbers of memory cell transistors MT and selection transistors ST1 and ST2 in a NAND string NS may be freely determined. The numbers of word lines WL and selection gate lines SGD and SGS may be changed in accordance with the numbers of memory cell transistors MT and selection transistors ST1 and ST2.

(3) Cross-Sectional Structure of Semiconductor Storage Device

Figure 3:
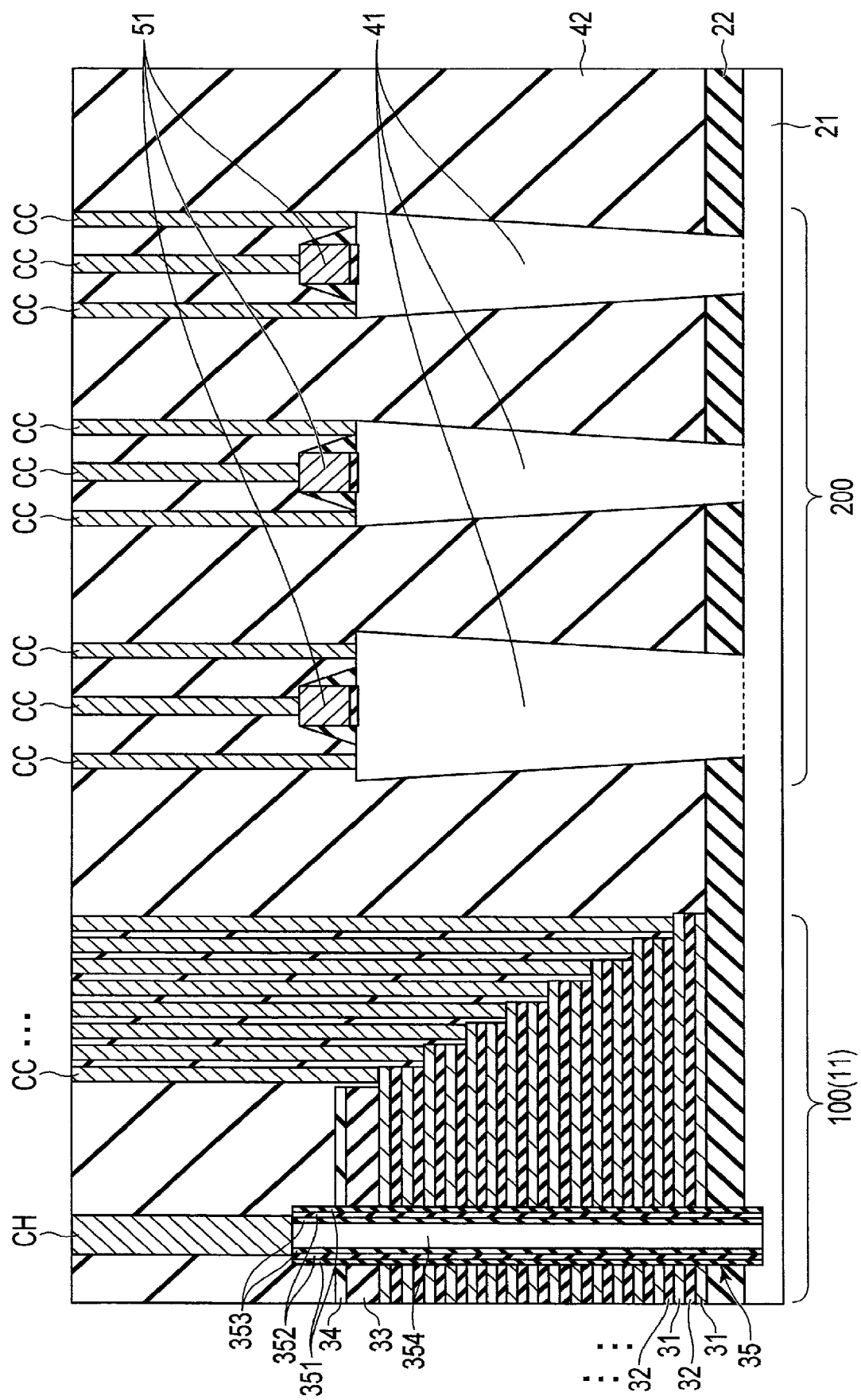
FIG. 3 is a cross-sectional view showing an example cross-sectional structure of the semiconductor storage device according to the first embodiment.

FIG. 3 is a cross-sectional view showing an example cross-sectional structure of the semiconductor storage device 1 according to the first embodiment. The example cross-sectional structure of the semiconductor storage device 1 according to the first embodiment as illustrated in FIG. 3 will be described below in detail.

As shown in FIG. 3, the semiconductor storage device 1 includes a memory cell region 100 and a peripheral circuitry region 200. The memory cell array 11, in which the memory cell transistors MT of FIG. 2 are three-dimensionally arranged, is provided in the memory cell region 100. Part of the structure of the memory cell array 11 is constituted by a laminated body including conductors 31, insulators 32, an insulator 33, a protective film 34, and a memory pillar 35. Metal oxide semiconductor (MOS) transistors 51, which are included in the peripheral circuitry of FIG. 1, are provided in the peripheral circuitry region 200 to serve as peripheral circuitry elements.

The semiconductor storage device 1 includes a semiconductor substrate 21. The semiconductor substrate 21 may be formed of monocrystalline silicon. Hereinafter, of the surfaces of the semiconductor substrate 21, a surface on or above which the memory cell array 11 and transistors 51 are arranged will be referred to as the top surface of the semiconductor substrate 21. In this specification, with regard to the laminating direction (vertical direction on the sheet of FIG. 3), the direction moving away from the top surface of the semiconductor substrate 21 is referred to as "upward", and the direction approaching the top surface of the semiconductor substrate 21 is referred to as "downward" for the sake of simplicity, but these directions have nothing to do with the gravitational direction.

In the example cross-sectional structure of the semiconductor storage device 1 in FIG. 3, a protective film 22 is provided on the top surface of the semiconductor substrate 21. The protective film 22 may be formed of silicon nitride SiN or carbon-doped silicon oxide SiCO.

The conductors 31 and insulators 32 are alternately laminated on the top surface of the protective film 22. An insulator 32 may be an oxide film of silicon oxide $SiO_2$ or the like.

Each conductor 31 serves as a word line WL, or as a selection gate line SGD or SGS. An insulator 32 is paired with a conductor 31 provided thereon, and pairs of conductors 31 and insulators 32 form a stepped structure with one pair forming one step. In a terrace of each step, a contact CC is provided on the top surface of the conductor 31.

The insulator 33 is provided on the top surface of the topmost conductor 31. The insulator 33 may be an oxide film, for example, of silicon oxide $SiO_2$. The protective film 34 is provided on the top surface of this insulator 33. The protective film 34 may be a nitride film, for example, of silicon nitride SiN.

The memory pillar 35 is embedded in the protective film 34, insulator 33, conductors 31, and insulators 32. The memory pillar 35 extends to the semiconductor substrate 21, and may be connected, for example, to a diffusion layer (not shown) formed in a region of the top surface of the semiconductor substrate 21. This diffusion layer contains impurities, and serves as a source line SL. The memory pillar 35 may include a block insulation film 351, a charge trap layer 352, a tunnel oxide film 353, and a semiconductor member 354. A portion of the memory pillar 35 that crosses each conductor 31 serves as a memory cell transistor MT, a selection transistor ST1, or a selection transistor ST2. A contact CH is provided on the top surface of the memory pillar 35.

A semiconductor (semiconductor layer) 41 extends through part of the protective film 22 (first region). The semiconductor 41 may extend in the laminating direction and reach the semiconductor substrate 21.

As illustrated in FIG. 3, the semiconductor 41 has a length in the first direction that decreases toward the bottom, with respect to the length of the first direction of the topmost surface of the semiconductor 41. The semiconductor 41, however, is not limited to this shape. For example, the semiconductor 41 may be formed into any shape having the length of the first direction of a lower portion that is smaller than the length of the first direction of the topmost surface of the semiconductor 41. This portion having the length of the first direction smaller than the length of the first direction of the topmost surface may be the lowermost surface of the semiconductor 41. The first direction is a direction parallel to the topmost surface of the semiconductor 41. The lengths of the first direction should be compared on the same cross-sectional surface, for example, perpendicular to the semiconductor substrate 21, as illustrated in FIG. 3.

The topmost surface of the semiconductor 41 is positioned higher than the topmost surface of the semiconductor substrate 21, as illustrated in FIG. 3. The position of the topmost surface of the semiconductor 41 may be determined with respect to the height in the laminating direction of any portion of the laminated body in the memory cell region 100. For instance, the topmost surface of the semiconductor 41 may be in an upper position with respect to the midpoint of the laminated body in the laminating direction. Alternatively, the topmost surface of the semiconductor 41 may be at the same position as the topmost surface of the laminated body in the laminating direction, or within a certain range from the topmost surface of the laminated body in the laminating direction.

A transistor 51 is provided on the top surface of each of the semiconductors 41. The transistor 51 includes a gate insulator formed on the top surface of the semiconductor 41, a gate electrode on the top surface of the gate insulator, and a pair of source/drain regions of the semiconductor 41 that are provided in such a manner as to sandwich the lower region of the gate insulator. The contacts CC are connected to the top surface of the gate electrode and to each of the source/drain regions. In FIG. 3, the transistor 51 is provided on the top surface of the semiconductor 41. However, the transistor 51 may be provided at any position above the semiconductor 41 with some layer interposed in-between. The position of the transistor 51 in the laminating direction may be determined based on the position of any portion of the laminated body in the laminating direction in the memory cell region 100. For instance, the position of the transistor 51 in the laminating direction may be at any position higher than the medium position of the laminated body in the laminating direction. Alternatively, the position of the transistor 51 in the laminating direction may be higher than the topmost surface of the laminated body, or may be within a certain range from the topmost surface of the laminated body in the laminating direction.

An interlayer insulator 42 is provided in the region above the top surface of the protective film 22 where none of the conductors 31, insulators 32, insulator 33, protective film 34, memory pillar 35, contacts CC and CH, semiconductors 41, or transistors 51 are provided. The interlayer insulator 42 may be formed of silicon oxide $SiO_2$.

In the above example, the semiconductor storage device 1 includes a protective film 22. However, the semiconductor storage device according to the present embodiment does not always require a protective film 22. Furthermore, in the above example, the diffusion layer provided in the semiconductor substrate 21 forms a source line SL of the memory cell array 11. However, the laminated body in the memory cell region 100 may have any structure as long as it forms part of the structure of the memory cell array 11.

[Manufacturing Method]

FIGS. 4 to 17 are cross-sectional views showing steps of an example manufacturing process of the semiconductor storage device 1 according to the first embodiment.

Figure 4:
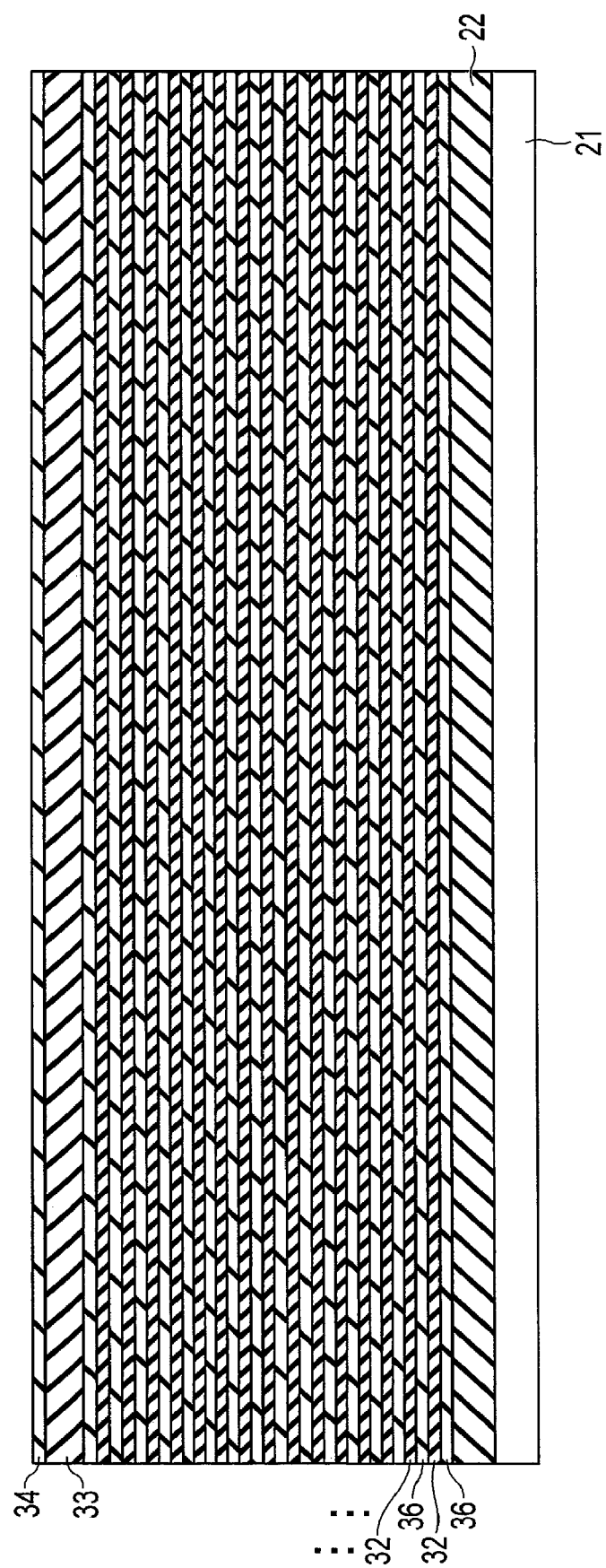
FIGS. 4 to 7 are cross-sectional views showing sequential steps of an example manufacturing process of the semiconductor storage device according to the first embodiment.

First, as illustrated in FIG. 4, the protective film 22 is formed on the top surface of the semiconductor substrate 21, and replacement members (sacrifice layers) 36 and insulators 32 are alternately stacked on the top surface of the protective film 22. The replacement members 36 may be nitride films of silicon nitride SiN or the like. The number of replacement members 36 may correspond to the total number of word lines WL and selection gate lines SGD and SGS for a NAND string NS. Furthermore, the insulator 33 is formed on the top surface of the topmost replacement member 36, and the protective film 34 is formed on the top surface of the insulator 33. In the example of FIGS. 4 to 17, the semiconductor storage device 1 includes a protective film 22. However, the semiconductor storage device according to the present embodiment does not always require a protective film 22, and the replacement members 36 and the insulators 32 may be alternately stacked directly on the top surface of the semiconductor substrate 21.

Figure 5:
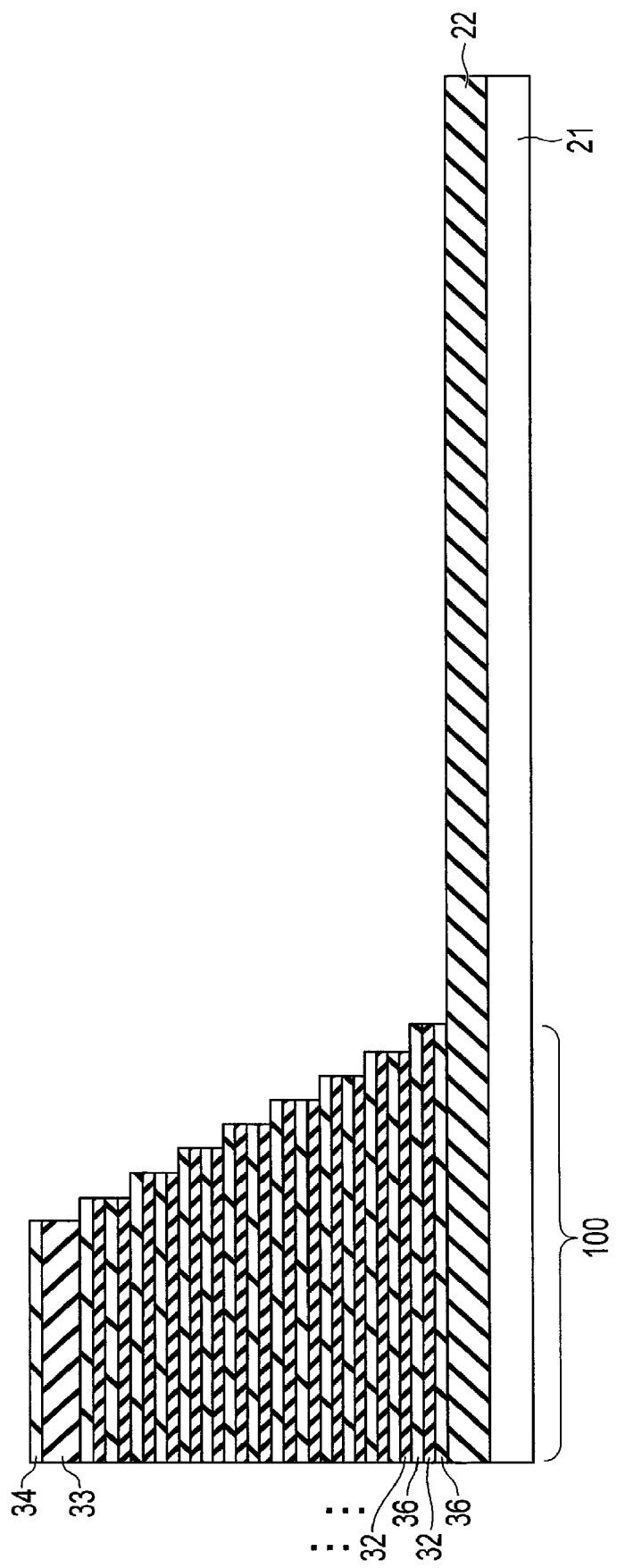

Next, the structure of FIG. 4 is processed into a stepped structure as illustrated in FIG. 5, for example, through lithography and etching. Specifically, the structure is processed so that every replacement member 36 can be provided with a portion that does not overlap any upper replacement members 36, insulators 32, insulator 33 and protective film 34. In addition, part of the protective film 22 is exposed. In the resultant stepped structure, a terrace is formed for every step, and a contact may be formed in each terrace to be coupled to the corresponding electrode or the like.

Figure 6:
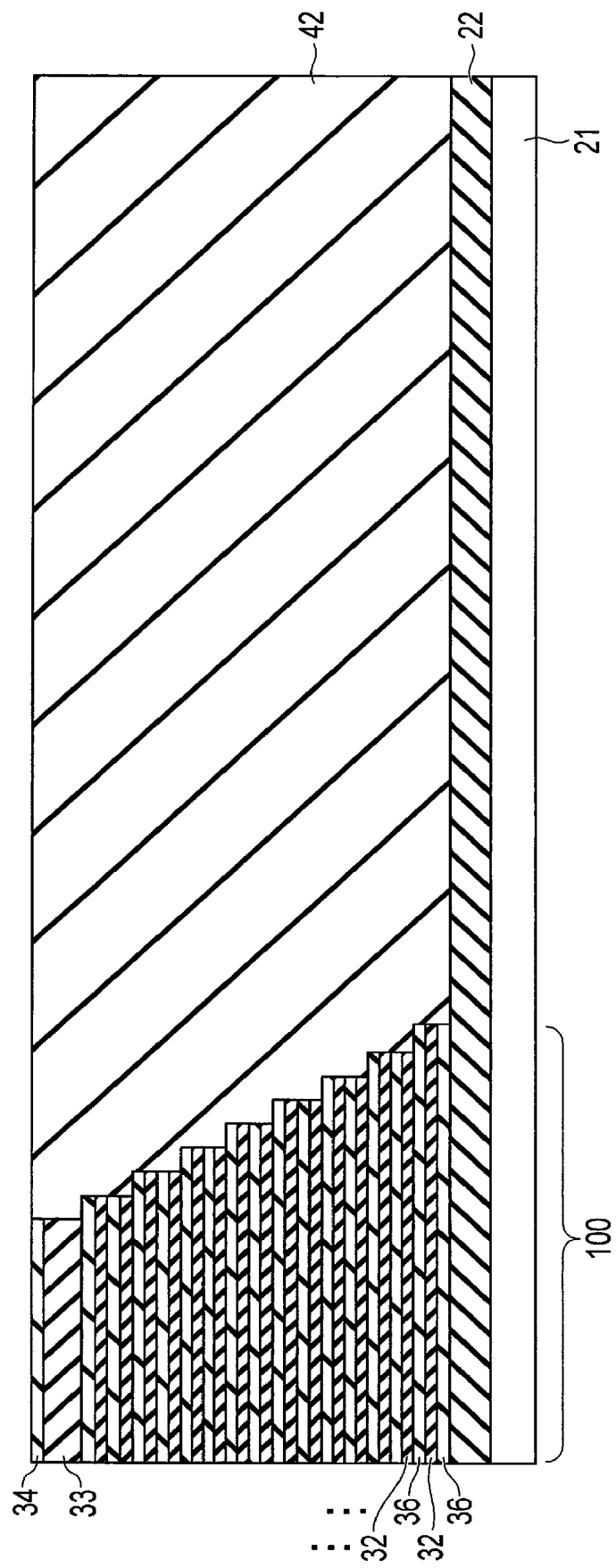

Thereafter, the interlayer insulator 42 is formed on the top surface of the exposed portion of the protective film 22 and on the top surface of the protective film 34, and the top surface of the interlayer insulator 42 is planarized, for example, by chemical mechanical polishing (CMP), as illustrated in FIG. 6.

Figure 7:
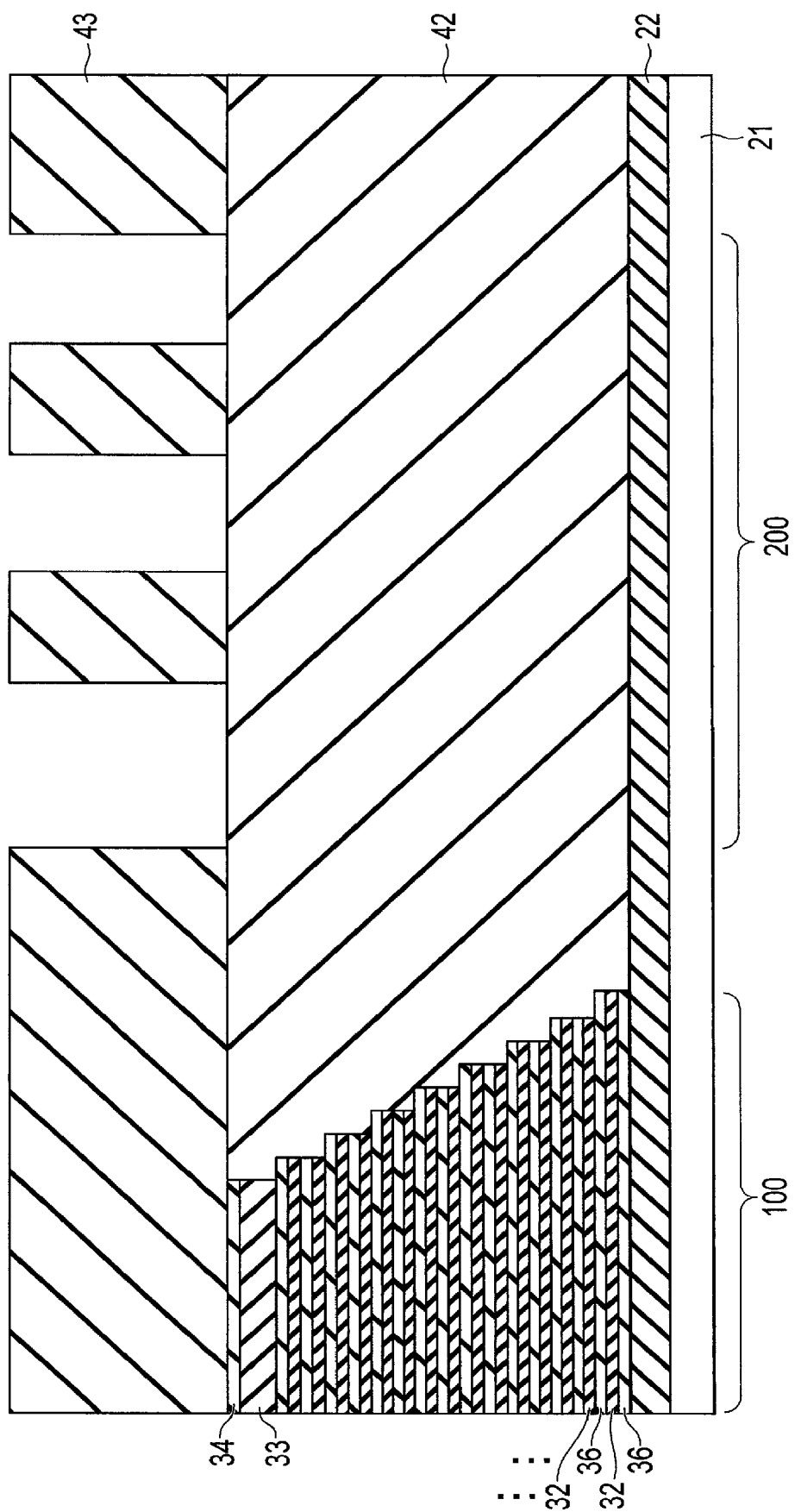
Figure 8:
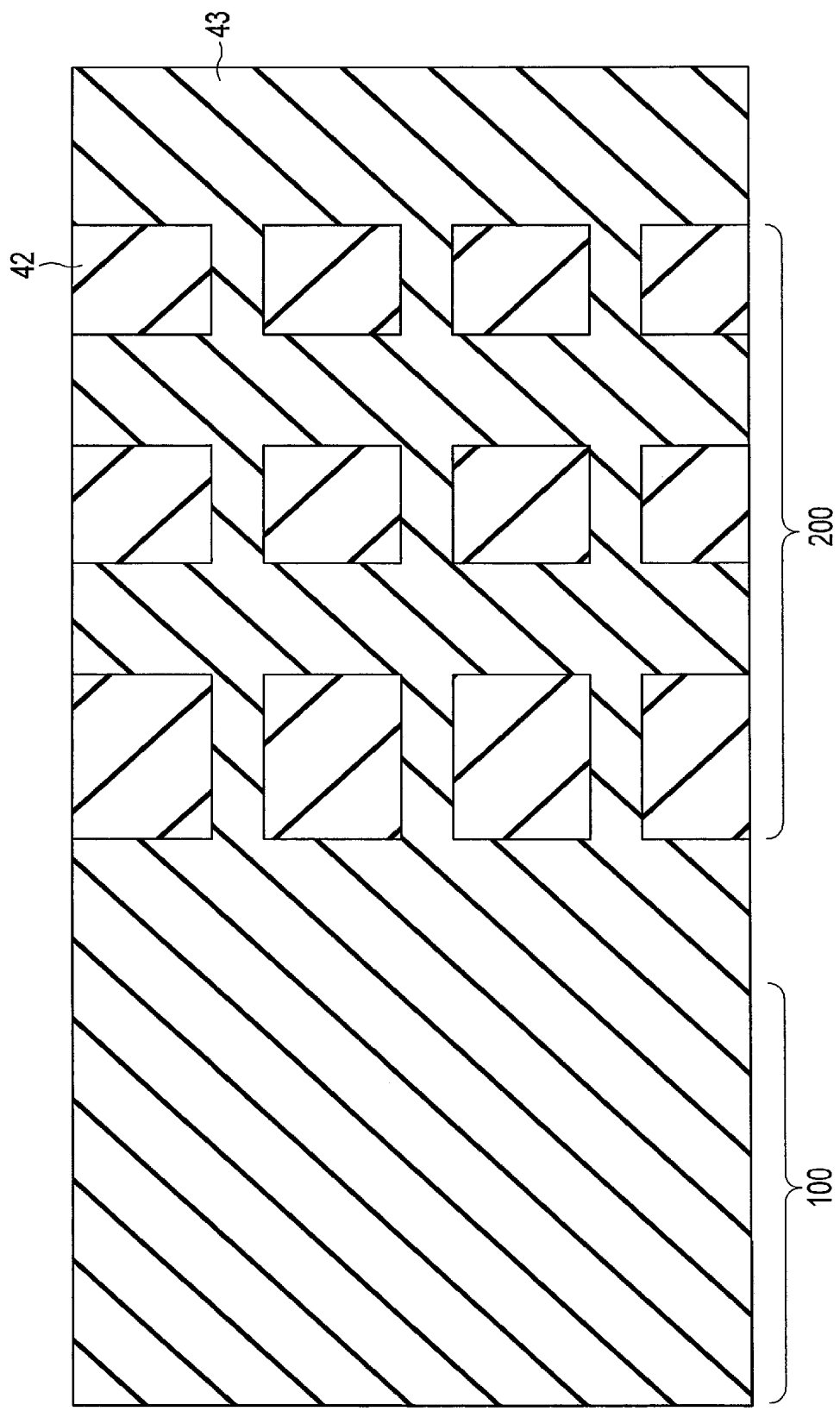
FIG. 8 is a plan view showing an example pattern of a peripheral circuitry region in the manufacturing process of the semiconductor storage device according to the first embodiment.

A hard mask 43 having a certain pattern is formed on the entire surface of the structure obtained in the above process, as illustrated in FIG. 7. Specifically, the hard mask 43 is formed on the top surface of the interlayer insulator 42 and also on the top surface of the protective film 34, and the hard mask 43 is processed into a certain pattern by lithography and etching. For the hard mask 43, an inorganic material such as tungsten, amorphous silicon, or sapphire may be adopted. FIG. 8 is a plan view of the structure of FIG. 7 when viewed from the above, showing an example pattern of the hard mask 43 for patterning of the peripheral circuitry region 200. As illustrated in FIG. 8, the hard mask 43 includes a plurality of openings that reach the interlayer insulator 42. The openings may be rectangular.

Figure 9:
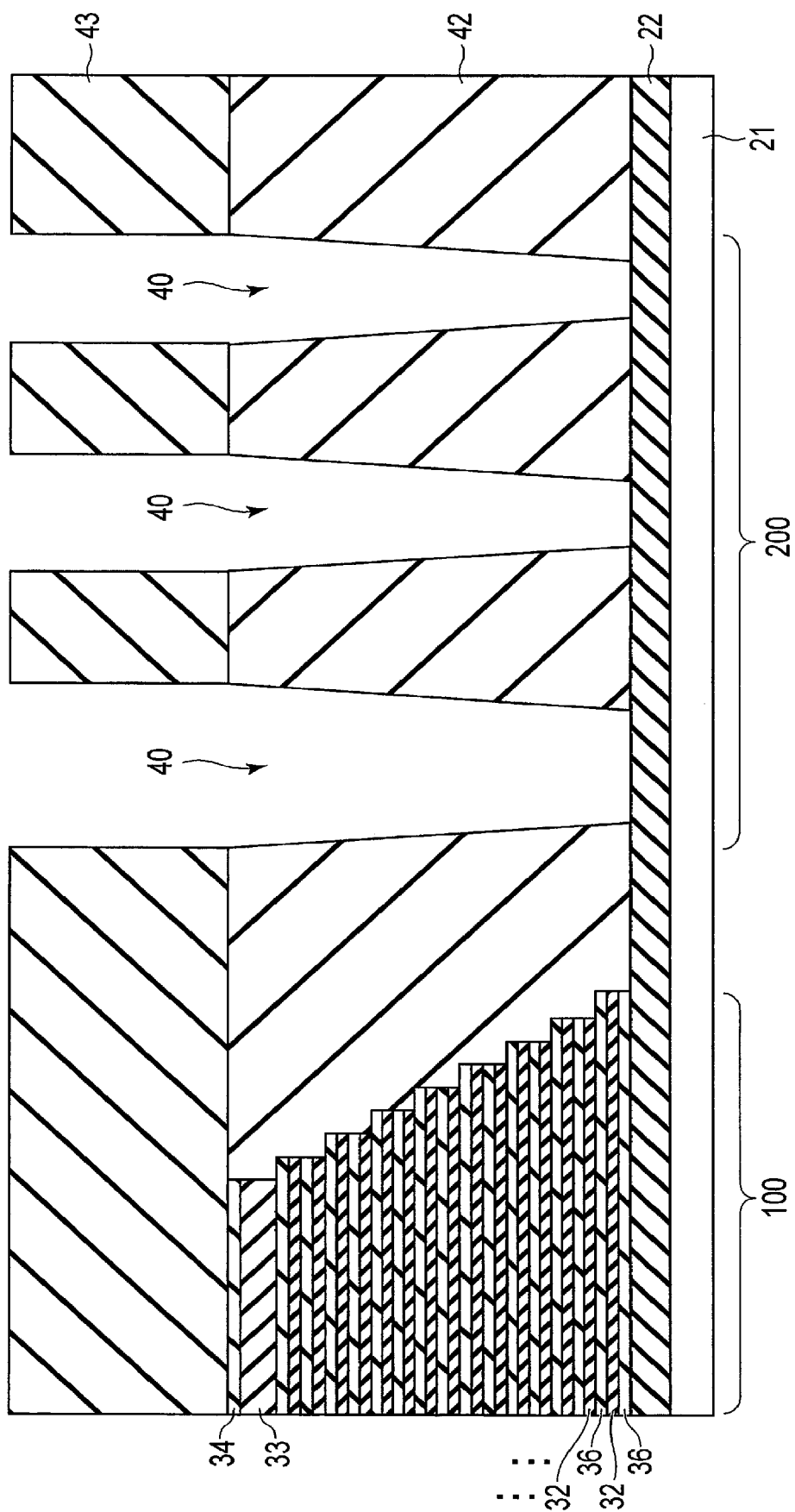
FIGS. 9 to 17 are cross-sectional views showing sequential steps of the example manufacturing process of the semiconductor storage device according to the first embodiment.

As illustrated in FIG. 9, the interlayer insulator 42 may be etched (patterned) by reactive ion etching (RIE) using the hard mask 43. The etched portions reach the protective film 22, as a result of which holes 40 are created in the interlayer insulator 42. The holes 40 reach the protective film 22. In the structure that does not incorporate a protective film 22 as discussed above, the etching reaches the semiconductor substrate 21. For such a structure, post-processing is required in order to prevent a substance (inhibition layer) that may inhibit the crystal growth, which will be discussed later, from being formed on the exposed top surface of the semiconductor substrate 21. As a result of the above etching, the holes 40 may be provided with the diameter of the first direction decreasing toward the bottom.

Figure 10:
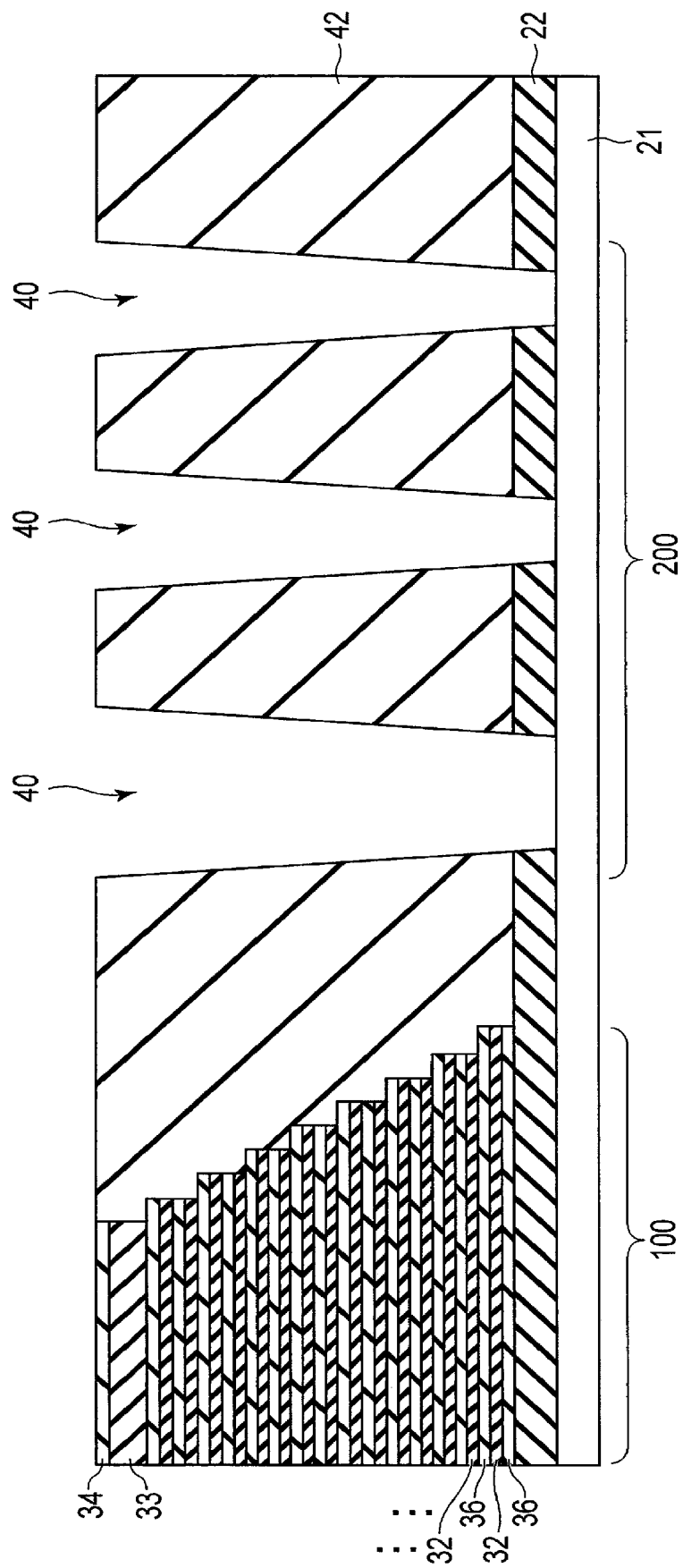

Next, as illustrated in FIG. 10, the etching of FIG. 9 is continued so that the exposed protective film 22 is etched off. This etching is performed to reach the semiconductor substrate 21, which means that the bottoms of the holes 40 reach the top surface of the semiconductor substrate 21. Thereafter, the hard mask 43 is removed.

Figure 11:
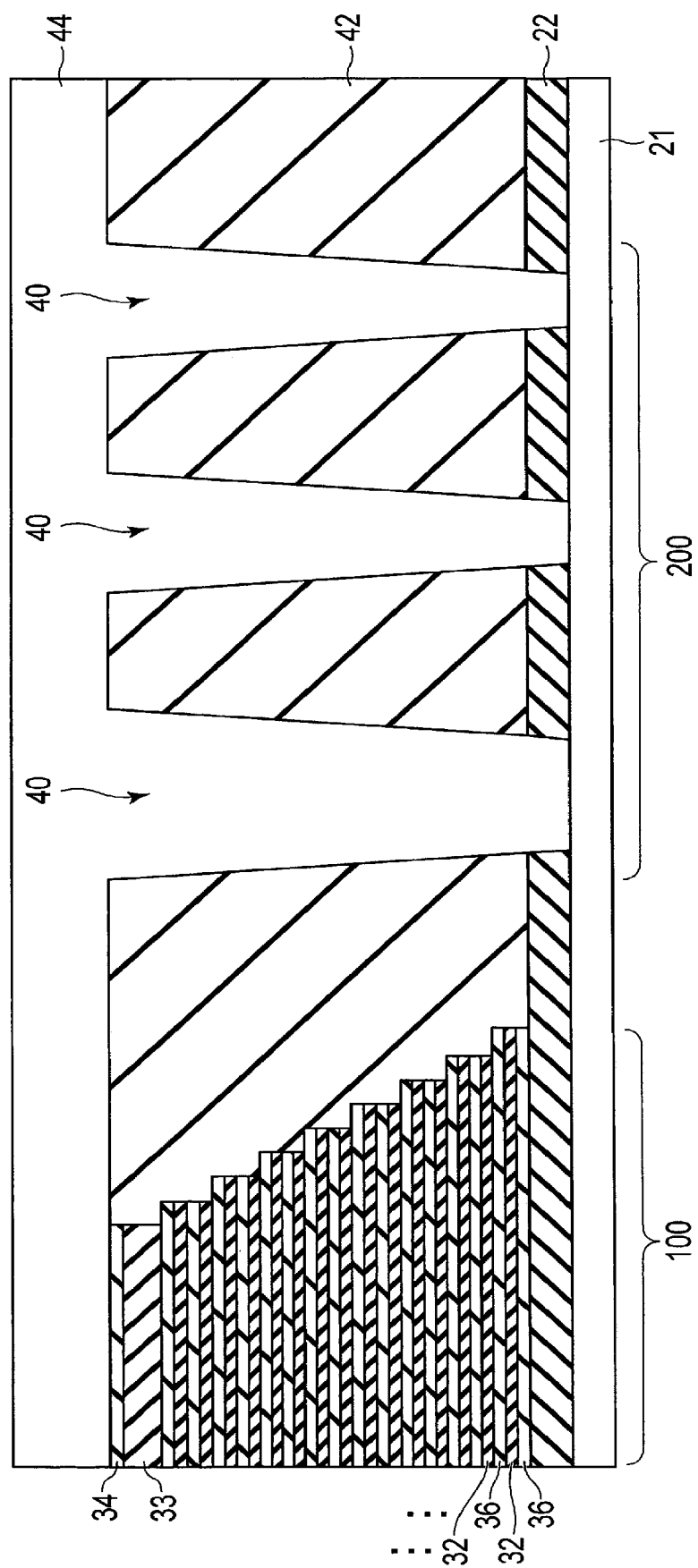

Then, as illustrated in FIG. 11, an amorphous silicon film 44 is formed over the entire surface of the resultant structure. This means that the amorphous silicon film 44 is deposited into the holes 40 of the patterned interlayer insulator 42, all the way down to the semiconductor substrate 21. The amorphous silicon film 44 is therefore formed on the top surface of the semiconductor substrate 21 that is exposed in the holes 40. In the formation of the amorphous silicon film 44, it is desirable that low-temperature film formation at 300 degrees Celsius or lower be adopted so as to reduce the size of the grains.

Figure 12:
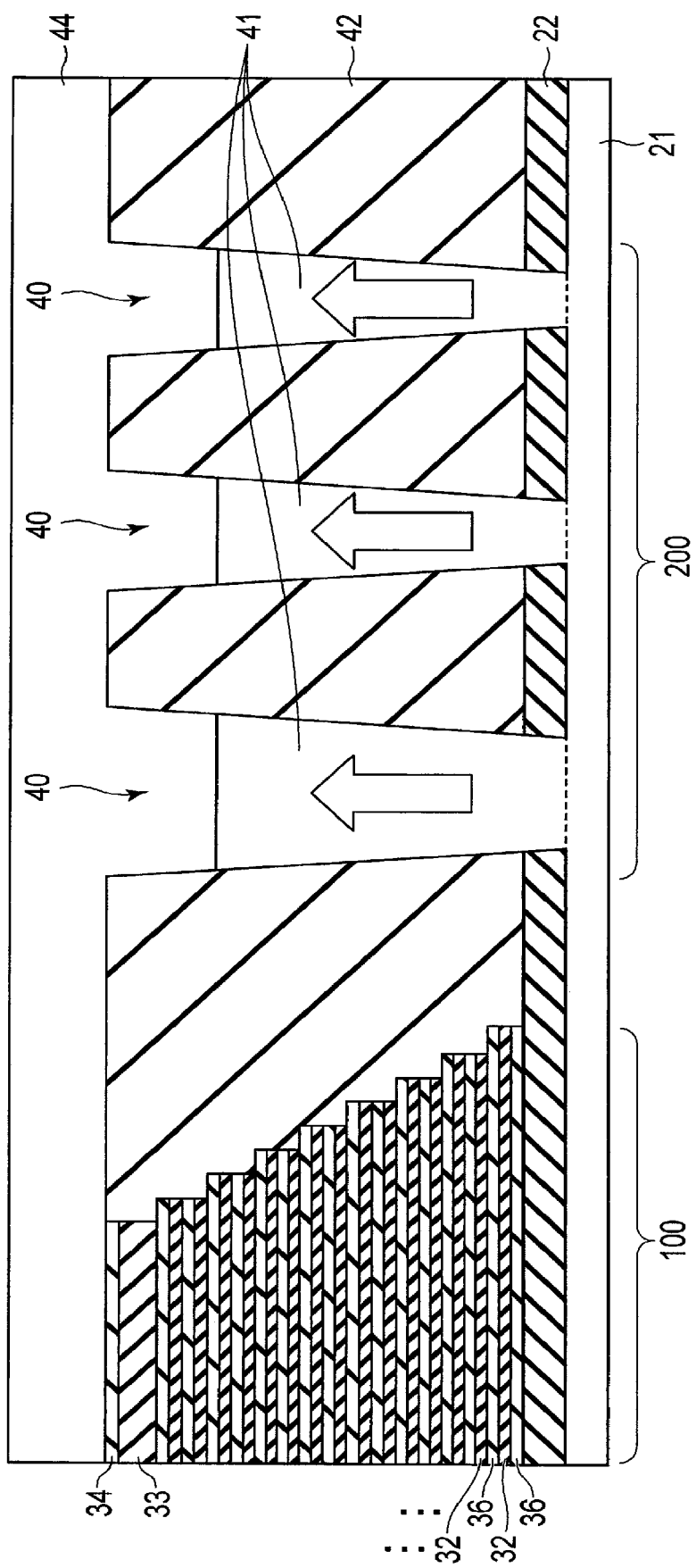
Figure 13:
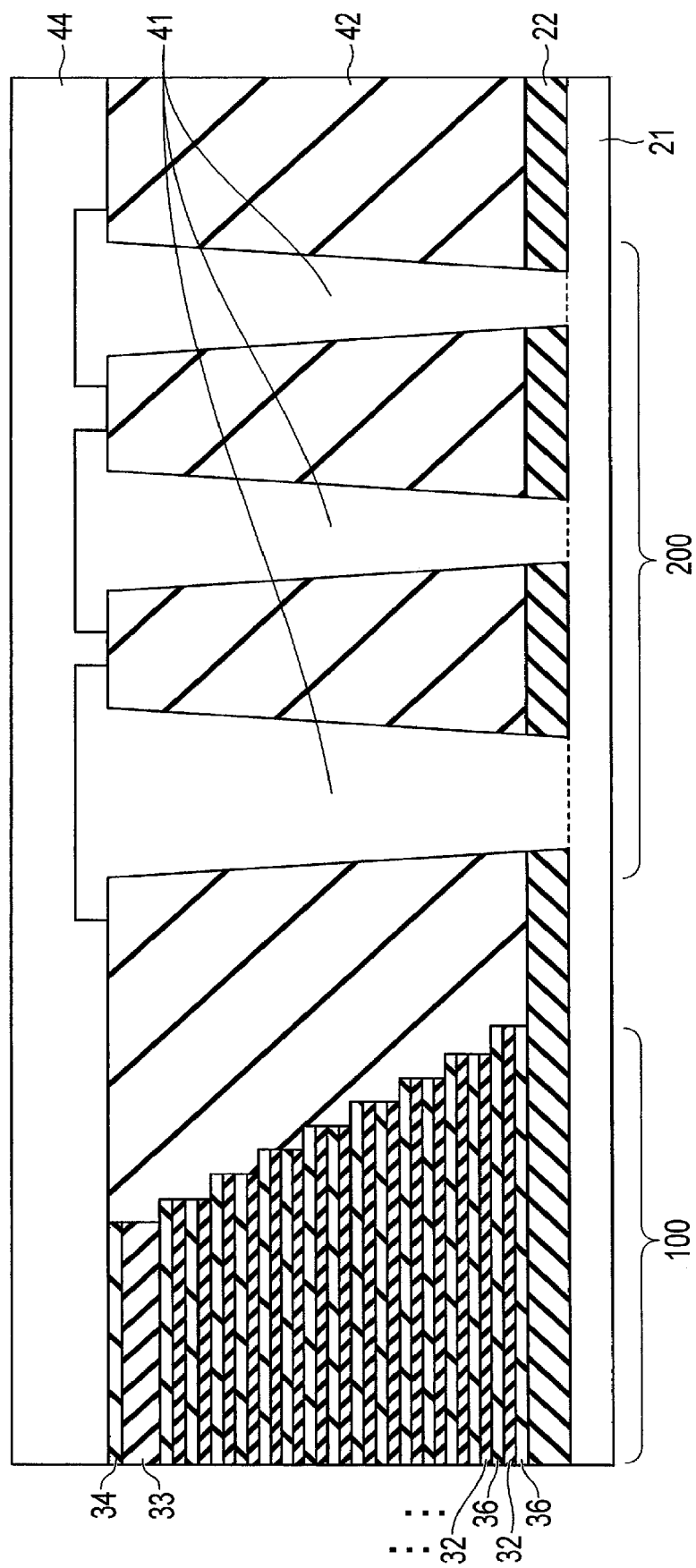

Thereafter, as illustrated in FIG. 12, annealing is performed to foster the crystal growth in the amorphous silicon film 44, as a result of which crystals are grown in the holes 40 along the inner walls of the patterned interlayer insulator 42, in an upward direction from the top surface of the semiconductor substrate 21. As the crystal growth continues, the amorphous silicon film 44 is crystallized in the holes 40, as a result of which semiconductors 41 are formed. For the semiconductors 41 prepared in this manner, their side surfaces become free of facets. In contrast to the monocrystalline semiconductor substrate 21, the semiconductors 41 that are prepared by annealing of the amorphous silicon film 44 are polycrystalline. The crystal growth may be continued until the semiconductors 41 exceed the height of the interlayer insulator 42 in the amorphous silicon film 44. Because of the reduced grain size in the formation of the amorphous silicon film 44, the growing speed of the semiconductors 41 can be maintained. For such solid-phase growth, annealing may be performed at 550 degrees Celsius for 24 hours under the condition of $H_2$ of a lightly lowered pressure. FIG. 13 shows a cross-sectional view of an example structure completed as a result of the annealing.

The above annealing may be performed after doping phosphorus (P) or boron (B) into the amorphous silicon film 44 to realize the doping density of 1E20 atoms/cm$^3$. In this manner, the speed of crystal growth can be improved. The phosphorous or boron doping may be realized by injecting phosphorus or boron ions into the amorphous silicon film 44 before the crystal growth. Alternatively, phosphorous or boron doping may be realized by mixing phosphorus or boron into the amorphous silicon material gas in the chamber of the chemical vapor deposition (CVD) apparatus when forming the amorphous silicon film 44.

Figure 14:
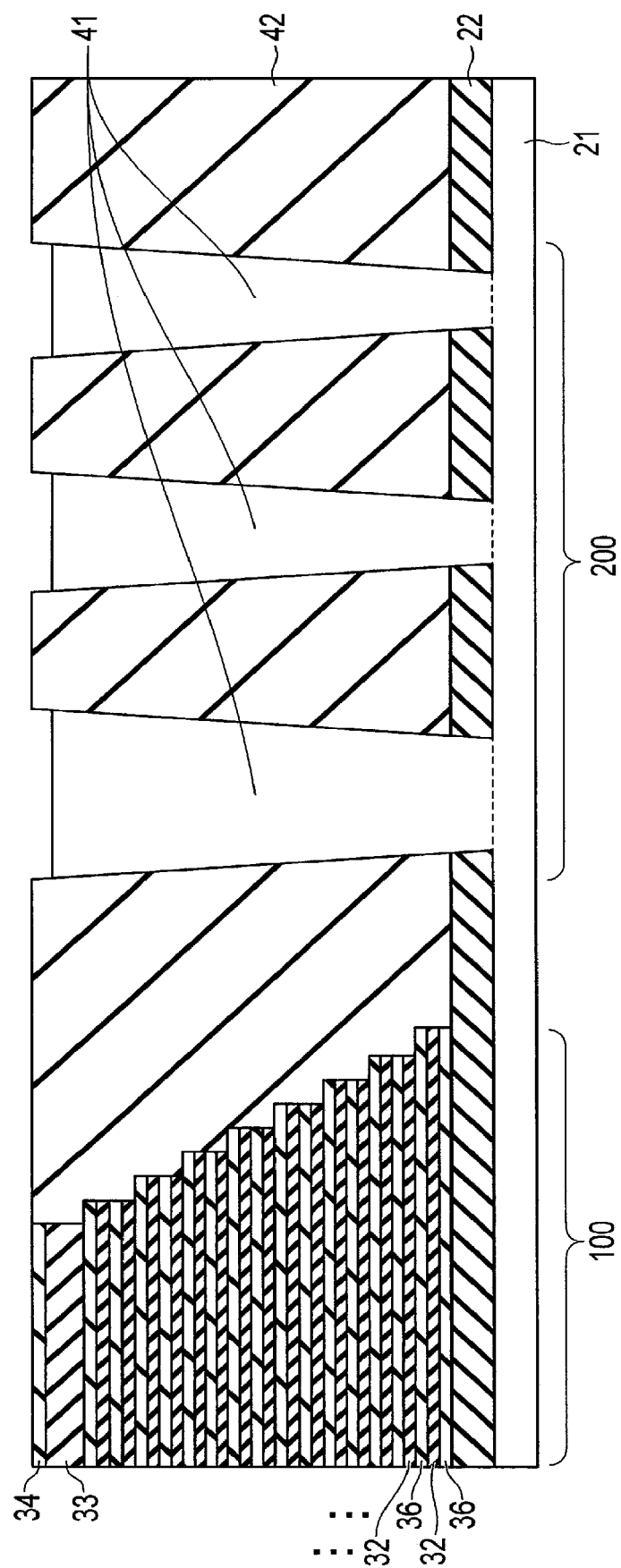

Thereafter, the remaining amorphous silicon film 44 and portions of the semiconductors 41 above the interlayer insulator 42 are etched away, as illustrated in FIG. 14. The resultant semiconductors 41 may have a diameter of the first direction decreasing toward the bottom.

Figure 15:
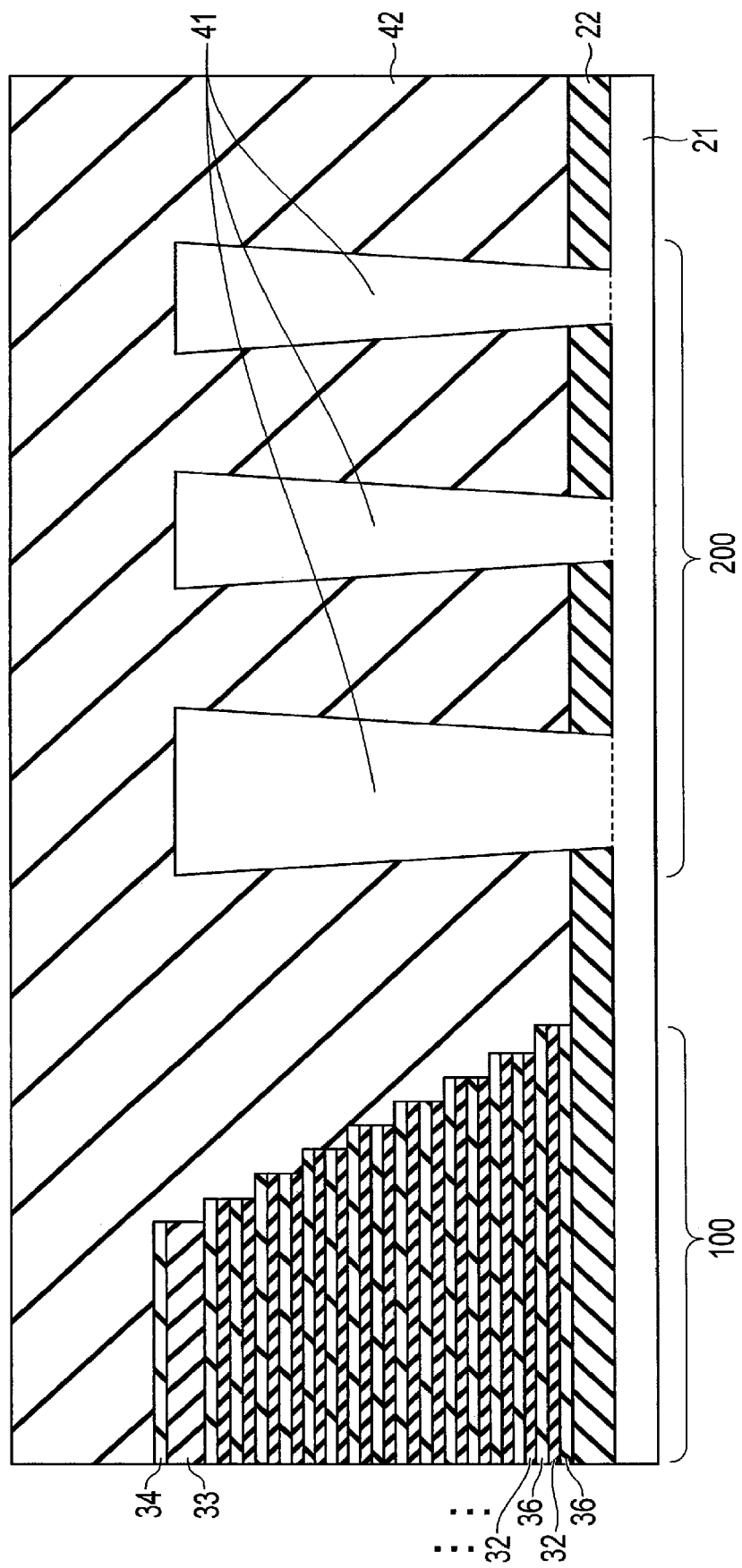

Next, an additional portion of the interlayer insulator 42 is formed on the entire surface of the resultant structure, as illustrated in FIG. 15, and thereafter the top surface of the interlayer insulator 42 is planarized, for example, by CMP.

Figure 16:
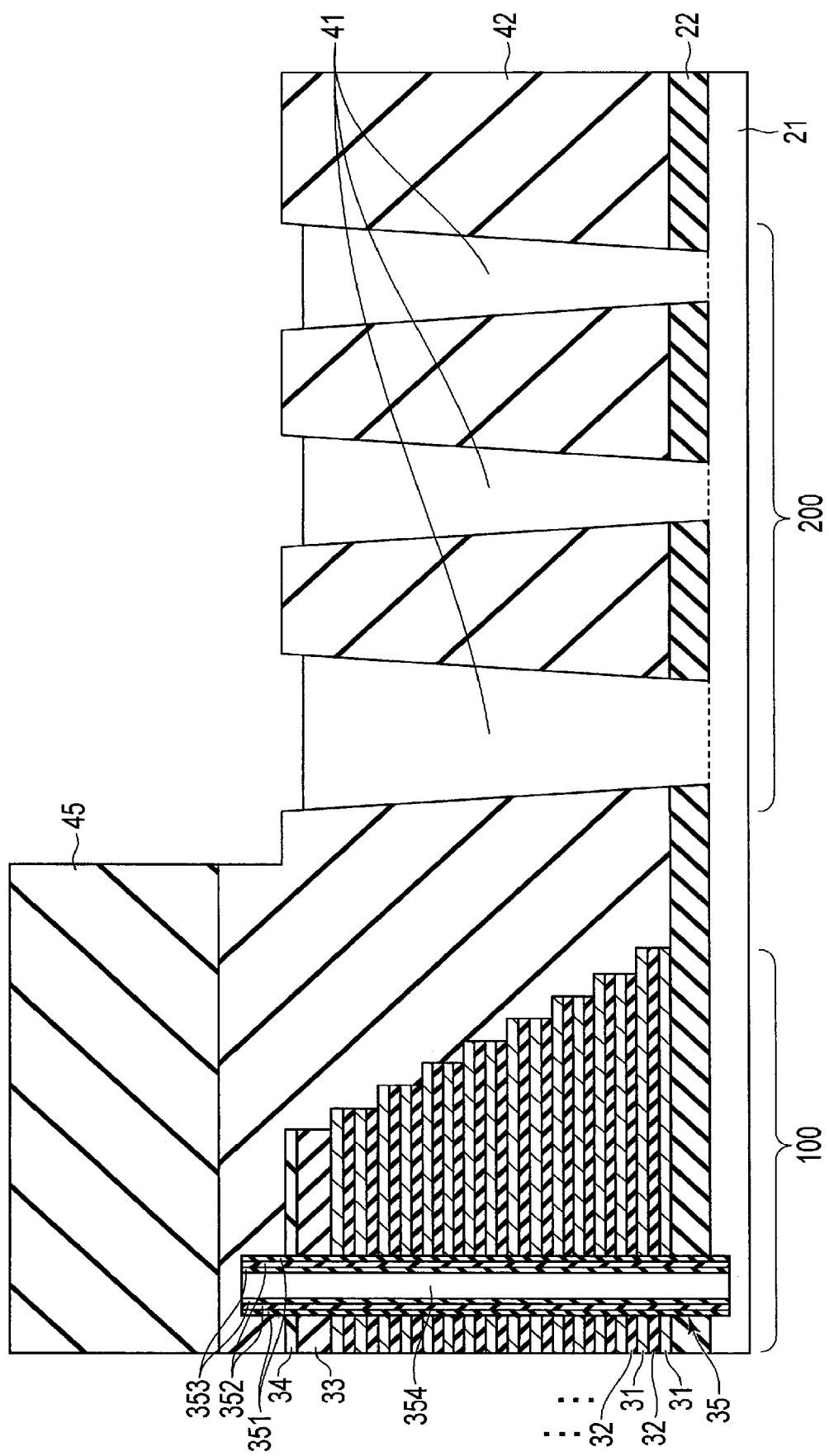

The memory pillar 35 is formed by anisotropic etching, as illustrated in FIG. 16. Specifically, a memory hole (not shown) is formed, for example, by RIE through the protective film 34, the insulator 33, the alternately stacked replacement members 36 and insulators 32, and the protective film 22 to extend from the top surface of the protective film 34 to the semiconductor substrate 21. Thereafter, the block insulation film 351, charge trap layer 352, tunnel oxide film 353, and semiconductor member 354 are formed in the memory hole. The replacement members 36 are replaced with conductors (conductive material). Specifically, after a slit (not shown) is formed, the replacement members 36 are removed by wet etching through the slit so that conductors are formed in the space left by removal of the replacement members 36. The conductors formed in the space left by removal of the replacement members 36 correspond to the conductors 31 as illustrated in FIG. 3. The slit may be formed in parallel to the step of forming memory holes.

Next, a hard mask 45 is formed entirely on the top surface of the interlayer insulator 42. This hard mask 45 is patterned by lithography and etching. By patterning, a portion of the hard mask 45 is removed from above the peripheral circuitry region 200 to expose the interlayer insulator 42 in the peripheral circuitry region 200. Thereafter, etching with the hard mask 45 is performed to remove the exposed portion of the interlayer insulator 42, thereby exposing the top surfaces of the semiconductors 41.

Figure 17:
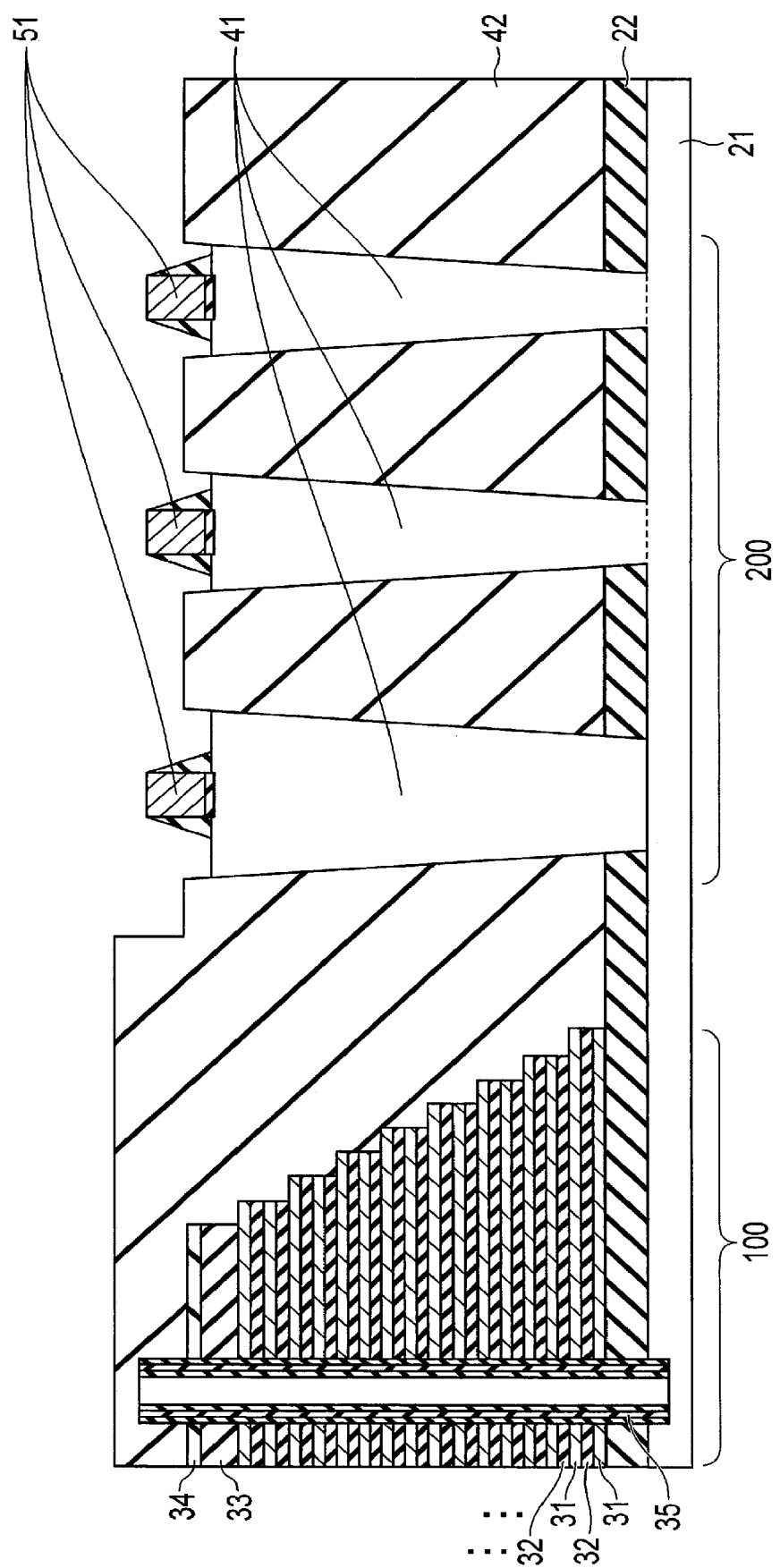

Next, the hard mask 45 is removed, and transistors 51 are formed on the top surfaces of the semiconductors 41, as illustrated in FIG. 17.

An additional portion of the interlayer insulator 42 is formed on the entire surface of the resultant structure. In the above structure, contact holes for the contacts CH and CC as illustrated in FIG. 3 are formed in the interlayer insulator 42. The contact holes may be created by dry etching such as RIE. By forming conductors in these contact holes, the contacts CH and CC are formed. Furthermore, by coupling the circuit elements to each other by way of the contacts CH and CC, the semiconductor storage device 1 is produced.

[Effects]

According to the first embodiment, the transistors 51 are formed above the semiconductors 41 that are provided on the top surface of the semiconductor substrate 21. As a result, the length of the contacts CC of the transistor 51 side, which extend to the top surface of the interlayer insulator 42 for coupling the transistors 51, for example, to the memory cell array 11, can be reduced. This facilitates the dry etching process when forming the contacts CC, and reduces the possibility of contact failure in the transistors 51.

Furthermore, according to the first embodiment, the transistors 51 are prepared in the peripheral circuitry region 200 after the memory cell array 11 is prepared in the memory cell region 100. With the semiconductor storage device 1 produced in this order, the peripheral circuitry elements including the transistors 51 will not be exposed to the thermal process for forming the memory cell array 11 in the memory cell region 100. This prevents the performance of the peripheral circuitry elements from being lowered by the thermal process that does not need to involve the peripheral circuitry region 200.

In addition, according to the first embodiment, the side surfaces of the semiconductors 41 are formed along the inner walls of the patterned interlayer insulator 42. The angle of the inner walls of the interlayer insulator 42 (inner walls of the holes 40) with respect to the top surface of the semiconductor substrate 21 may be adjusted by etching that is performed for the patterning. For example, the interlayer insulator 42 may be patterned to have inner walls as perpendicular to the top surface of the semiconductor substrate 21 as possible so that the side surfaces of the semiconductors 41 will also become as perpendicular to the top surface of the semiconductor substrate 21 as possible. Thus, a semiconductor storage device 1 that makes effective use of the region above the semiconductor substrate 21 can be realized.

Modified Example

The formation of semiconductors 41 by annealing the amorphous silicon film 44 for crystal growth as illustrated in FIG. 12 has been described in the above.

Figure 18:
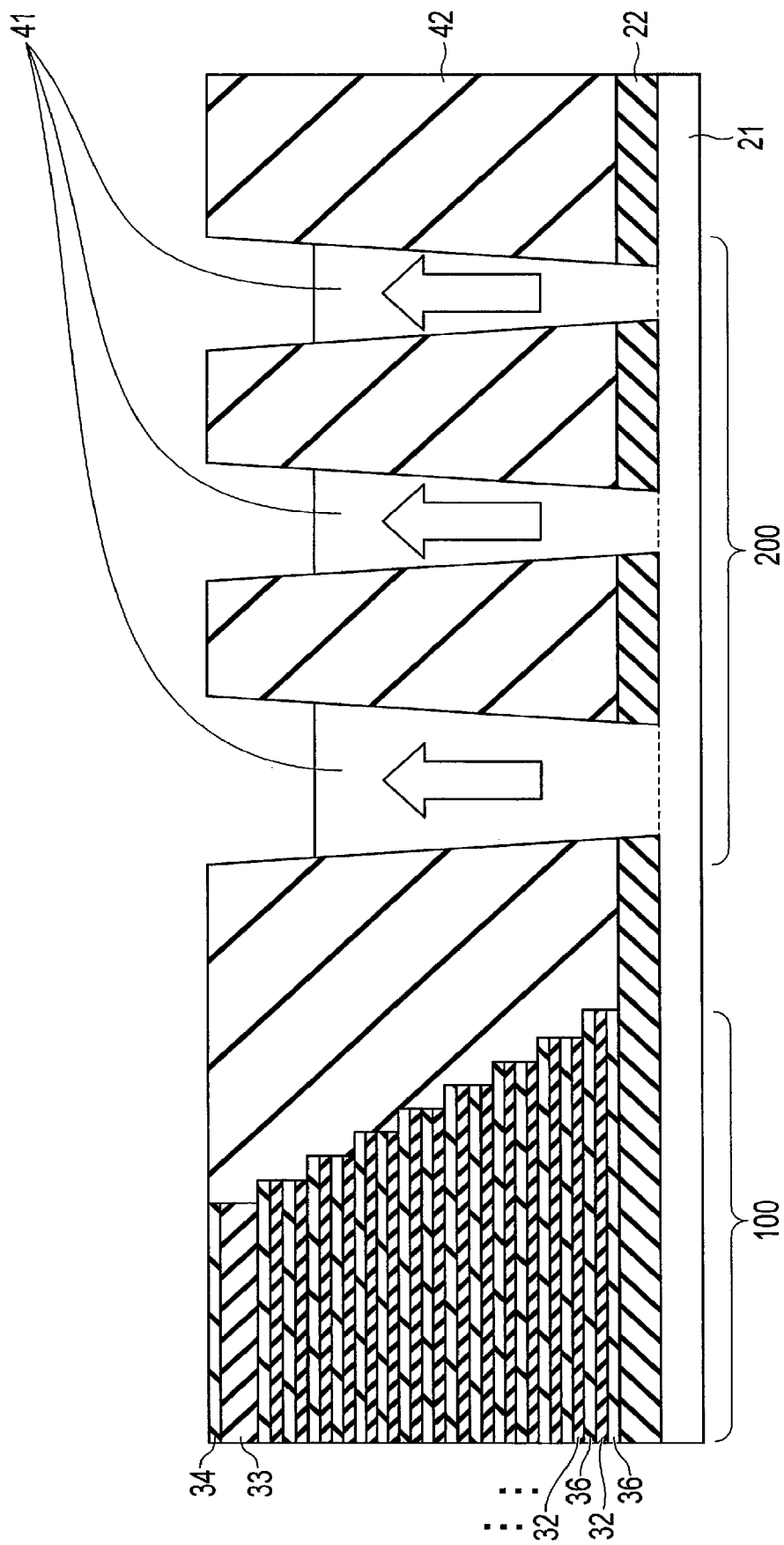
FIGS. 18 and 19 are cross-sectional views showing an example manufacturing process of a semiconductor storage device according to a modification of the first embodiment.
Figure 19:
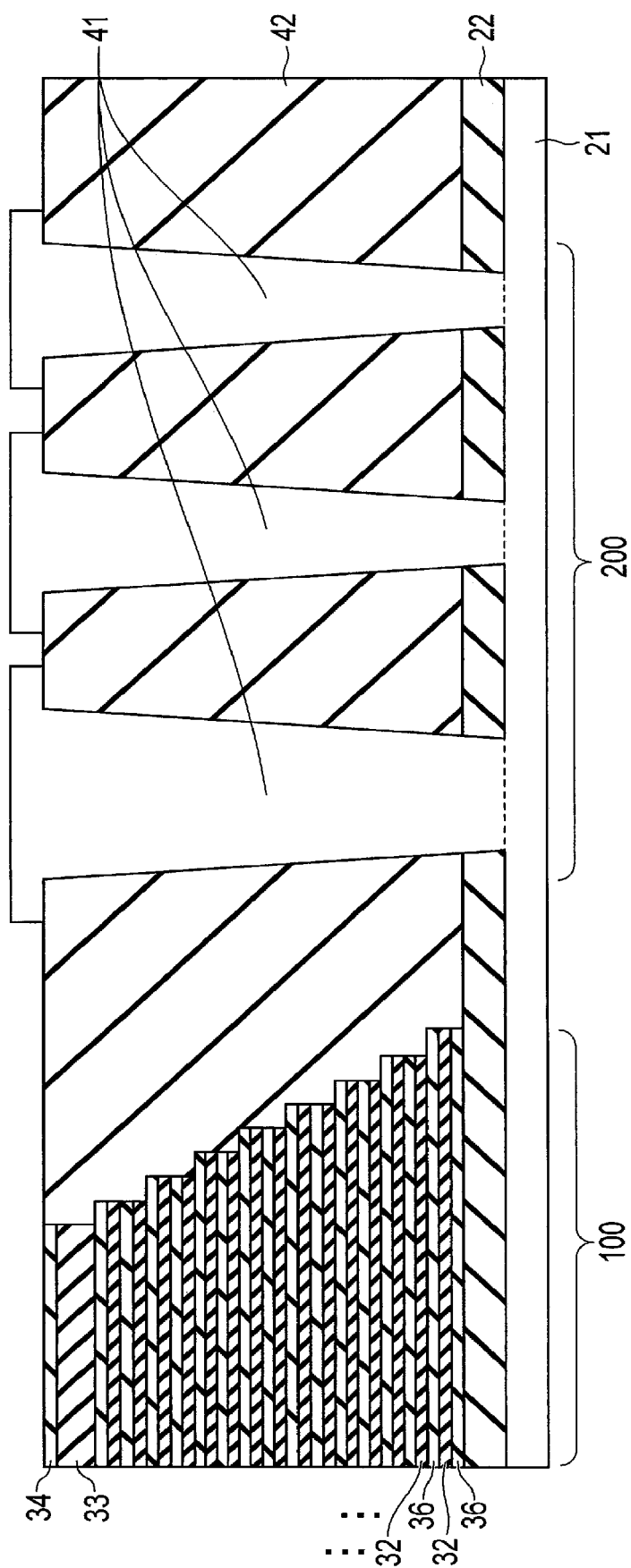

The present embodiment, however, is not limited thereto. For example, after the processes of FIGS. 4 to 10, vapor phase epitaxy may be performed on the semiconductor substrate 21 for epitaxial growth so that the semiconductors 41 can be formed along the inner walls of the interlayer insulator 42 in an upward direction from the top surface of the semiconductor substrate 21, as illustrated in FIG. 18. Here, by controlling the conditions for the epitaxial growth, the formation of any facet on the side surfaces of the semiconductors 41 can be suppressed. The epitaxial growth may be continued until it exceeds the height of the interlayer insulator 42. The conditions may be determined as 1040 degrees Celsius, DCS=400 cc, HCl=1000 cc, 50 Torr. FIG. 19 is a cross-sectional view of an example structure obtained at the end of the epitaxial growth. Thereafter, etching is performed to remove the portions of the semiconductors 41 higher than the interlayer insulator 42, as a result of which the structure of FIG. 14 can be obtained. After this etching, the processes of FIGS. 15 to 17 may be adopted to produce the semiconductor storage device 1 as illustrated in FIG. 3.

Second Embodiment

A semiconductor storage device according to the second embodiment will be discussed below. The entire configuration of the semiconductor storage device according to the second embodiment may be the same as the configuration according to the first embodiment as illustrated in FIG. 1. The circuitry configuration of the memory cell array in the semiconductor storage device according to the second embodiment may be the same as the circuitry configuration according to the first embodiment as illustrated in FIG. 2.

[Example Structure]

Figure 20:
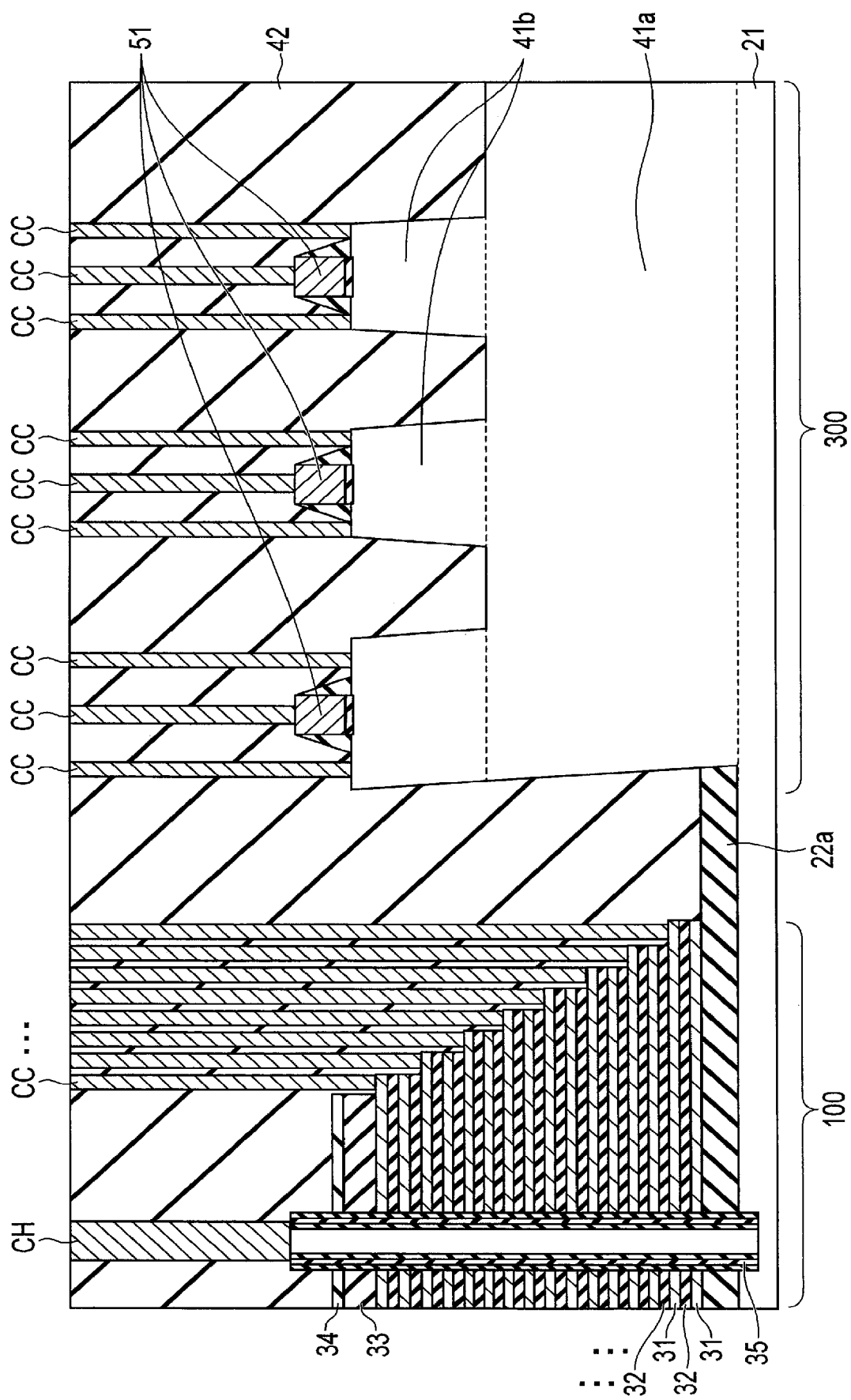
FIG. 20 is a cross-sectional view showing an example cross-sectional structure of a semiconductor storage device according to a second embodiment.

FIG. 20 is a cross-sectional view showing an example cross-sectional structure of the semiconductor storage device 1 according to the second embodiment. The semiconductor storage device 1 according to the second embodiment includes the memory cell region 100 and a peripheral circuitry region 300, as illustrated in FIG. 20. The memory cell region 100 has the same structure as the memory cell region 100 of FIG. 3 according to the first embodiment. The peripheral circuitry region 300 is differentiated from the peripheral circuitry region 200 of FIG. 3 according to the first embodiment in the shape of the semiconductor formed on the top surface of the semiconductor substrate 21.

An example of the semiconductor storage device 1 according to the second embodiment as illustrated in FIG. 20 will be explained, focusing mainly on the shapes of the semiconductors 41a and 41b provided on the top surface of the semiconductor substrate 21 in the peripheral circuitry region 300.

As illustrated in FIG. 20, the semiconductor storage device 1 includes the semiconductor substrate 21, on the top surface of which a protective film 22a is provided. The protective film 22a may be of silicon nitride SiN or carbon-doped silicon oxide SiCO. Here, a semiconductor 41a is formed through a portion of the protective film 22a (first region). The semiconductor 41a extends, for example, along the laminating direction and reaches the semiconductor substrate 21.

Semiconductors 41b are formed on the top surface of the semiconductor 41a. The length of each semiconductor 41b in the first direction may increase from the length in the first direction of the top surface of the semiconductor 41b toward the bottom, as illustrated in FIG. 20. The first direction is a direction parallel to the topmost surface of the semiconductor 41b. The lengths of the first direction should be compared on the same cross-sectional surface, for example, perpendicular to the semiconductor substrate 21, as illustrated in FIG. 20. The semiconductor 41a and semiconductors 41b are distinguished from each other merely for the sake of convenience, and therefore the semiconductors 41a and 41b may be provided as part of the same semiconductor in the structure of FIG. 20. In the same manner as the first embodiment, the position of the topmost surface of the semiconductor 41b may be determined based on the position of a portion of the laminated body in the memory cell region 100 in the laminating direction. A transistor 51 is arranged on each of the semiconductors 41b. Although the transistor 51 is illustrated as being provided on the top surface of the semiconductor 41b in FIG. 20, the transistor 51 may be provided at any position above the semiconductor 41b with any layer interposed in-between. In the same manner as in the first embodiment, the position of the transistor 51 in the laminating direction may be determined based on the position of any portion of the laminated body in the laminating direction in the memory cell region 100.

The heights of the semiconductor 41a and semiconductors 41b in the laminating direction may be freely determined. The topmost surface of the semiconductor 41a may be positioned at the same height as the top surface of the semiconductor substrate 21 in the laminating direction, and therefore the bottommost surface of the semiconductors 41b may be positioned at the same height as the top surface of the semiconductor substrate 21 in the laminating direction.

[Manufacturing Method]

FIGS. 21 to 27 are cross-sectional views showing steps of an example manufacturing process of the semiconductor storage device 1 according to the second embodiment. The method for manufacturing the semiconductor storage device 1 according to the second embodiment will be explained, mainly focusing on the differences with respect to the first embodiment.

Figure 21:
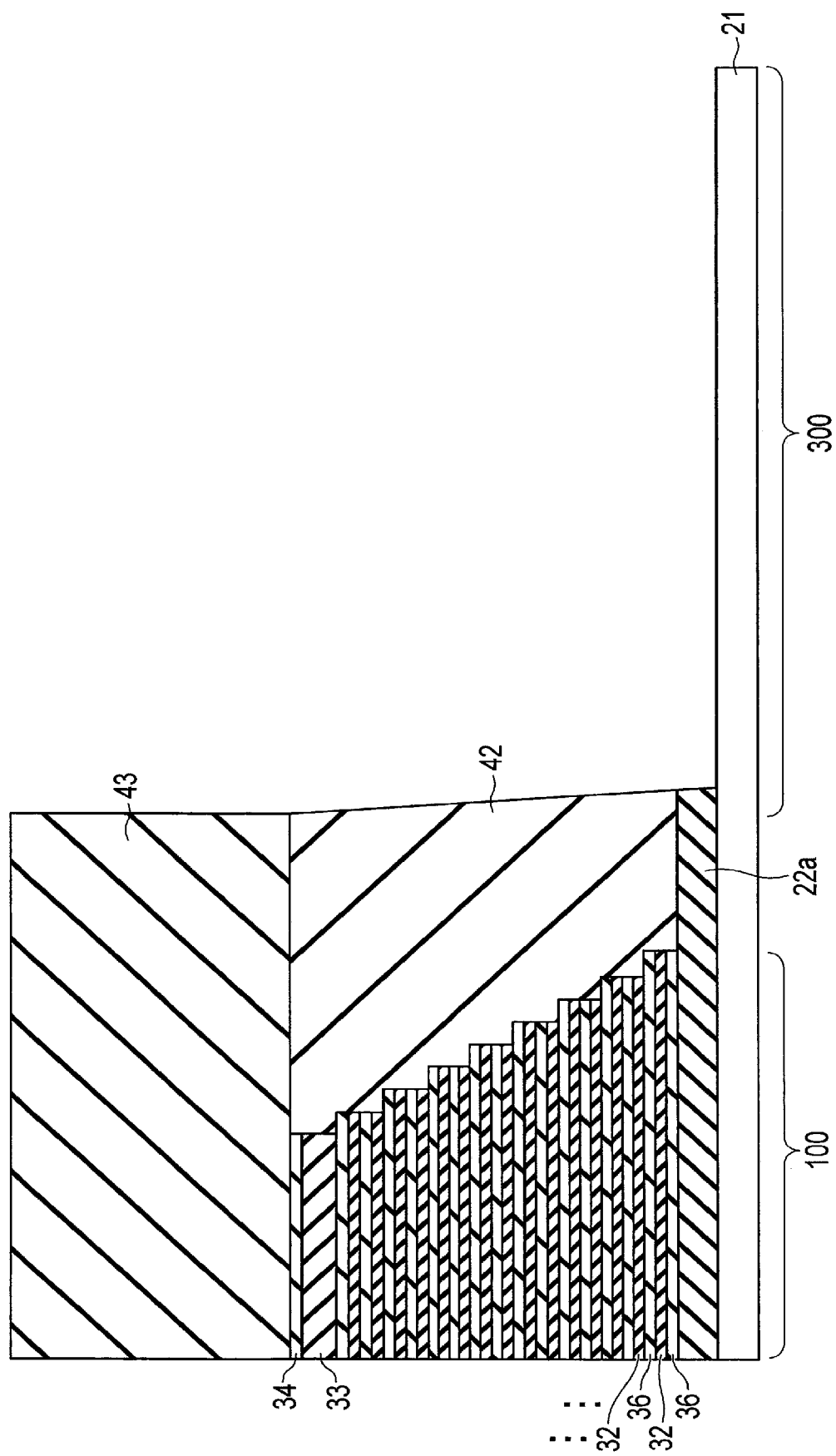

First, the processes as illustrated in FIGS. 4 to 10 are performed. In the formation of the hard mask 43 of FIG. 7, the hard mask 43 is patterned, for example, by lithography and etching to remove a portion of the hard mask 43 in the peripheral circuitry region 300 so as to expose the top surface of the interlayer insulator 42 in the entire peripheral circuitry region 300, as illustrated in FIG. 21. In this manner, the etching of FIGS. 9 and 10 for the interlayer insulator 42 reaches the semiconductor substrate 21 in the entire peripheral circuitry region 300. Thereafter, the hard mask 43 is removed.

Figure 22:
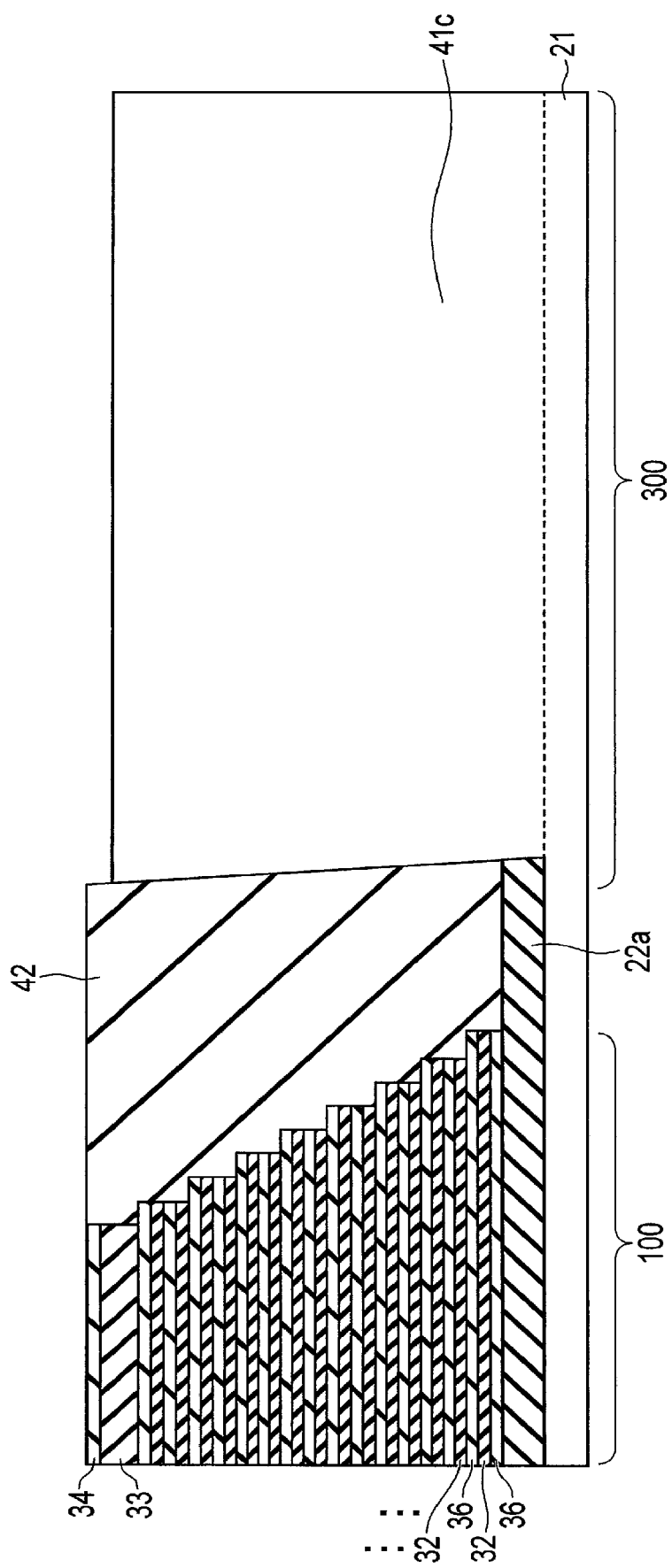

Next, vapor phase epitaxy is performed on the semiconductor substrate 21 for epitaxial growth along an inner wall of the interlayer insulator 42 with the same process as in FIG. 18 so that the semiconductor 41c can be formed in an upward direction from the top surface of the semiconductor substrate 21, as illustrated in FIG. 22. Here, by controlling the conditions for the epitaxial growth as explained with reference to FIG. 18, the formation of a facet on a side surface of the semiconductor 41c can be suppressed. The epitaxial growth may be continued until it exceeds the height of the interlayer insulator 42. Thereafter, etching is performed to remove the portion of the semiconductor 41c higher than the interlayer insulator 42.

Figure 23:
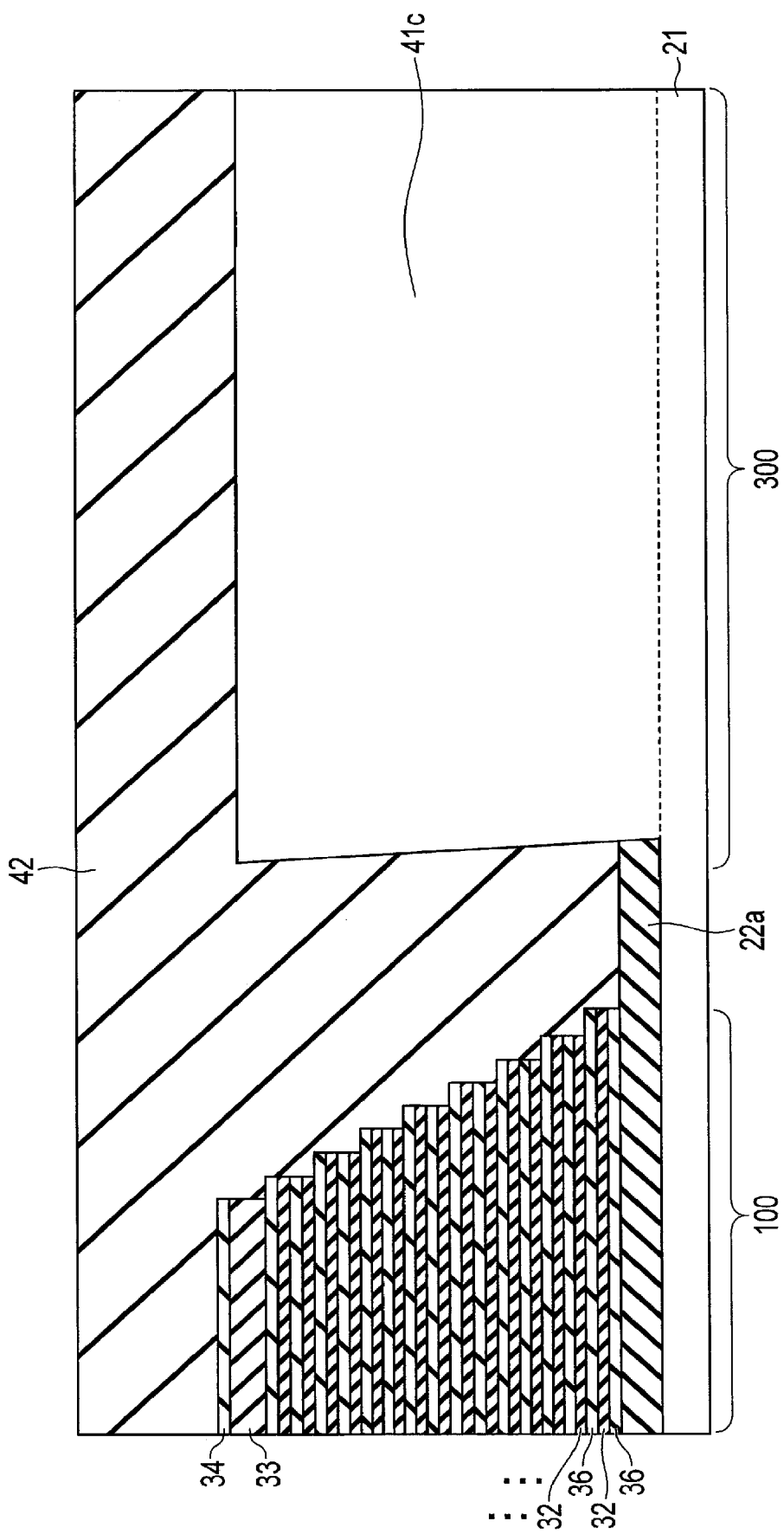

As illustrated in FIG. 23, in the same process explained in FIG. 15, an additional portion of the interlayer insulator 42 is formed on the top surfaces of the protective film 34, the interlayer insulator 42 and the semiconductor 41c, and the top surface of the interlayer insulator 42 is planarized by CMP.

Figure 24:
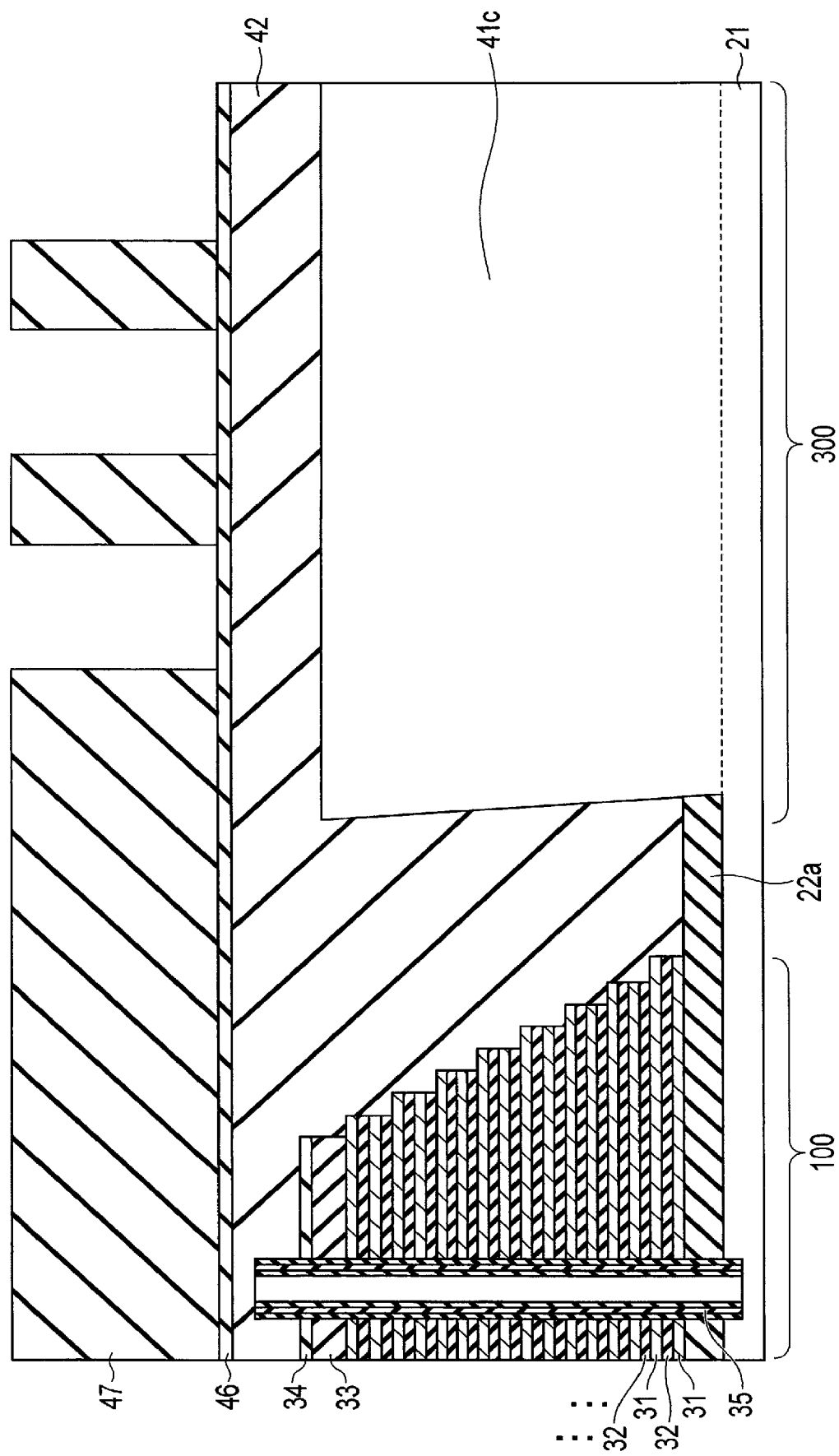

Then, in the same process as in FIG. 16, the memory pillar 35 is formed as illustrated in FIG. 24. A protective film 46, which is a nitride film of silicon nitride SiN or the like, is formed on the entire surface of the resultant structure. A hard mask 47 is formed on the top surface of the protective film 46. This hard mask 47 is patterned by lithography and etching so as to remove portions of the hard mask 47 to form trenches 50 for the separation of the devices. For the hard mask 47, an inorganic material such as tungsten, amorphous silicon, or sapphire may be adopted.

Figure 25:
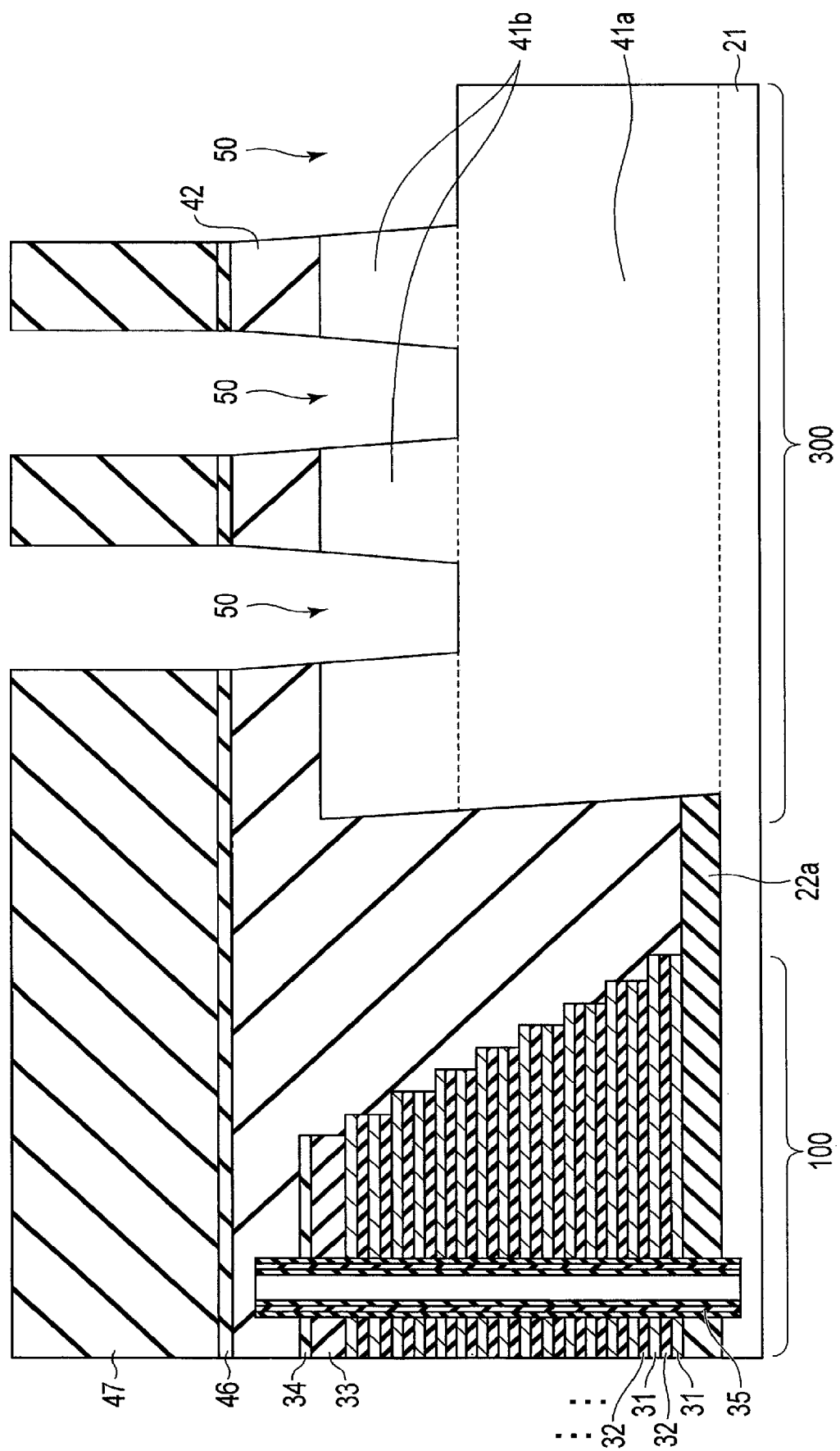

Next, as illustrated in FIG. 25, etching (patterning) may be performed by RIE using the hard mask 47 on the protective film 46, interlayer insulator 42 and semiconductor 41c. This etching can be performed until it reaches any desired position of the semiconductor 41c in the laminating direction. The etching may be continued to a position at which a finished product will be capable of electrically separating adjacent transistors 51 from each other under the application of a voltage. Trenches 50 are formed in the semiconductor 41c by the etching. Of the semiconductor 41c patterned by the etching, portions above the height of the bottom surfaces of the trenches 50 correspond to semiconductors 41b, and the portion beneath the height of the bottom surfaces of the trenches 50 corresponds to the semiconductor 41a. In the above etching, each of the trenches 50 may be formed with the diameter of the first direction reducing toward the bottom. The resultant semiconductor 41b has a diameter of the first direction increasing toward the bottom.

Thereafter, the hard mask 47 is removed, as illustrated in FIG. 26. The interlayer insulator 42 is deposited in the trenches 50. The deposition of the interlayer insulator 42 may be continued to a position higher than the protective film 46. The portion of the interlayer insulator 42 deposited at a position higher than the top surface of the protective film 46 is removed by CMP or the like. Thereafter, the protective film 46 is removed.

Figure 27:
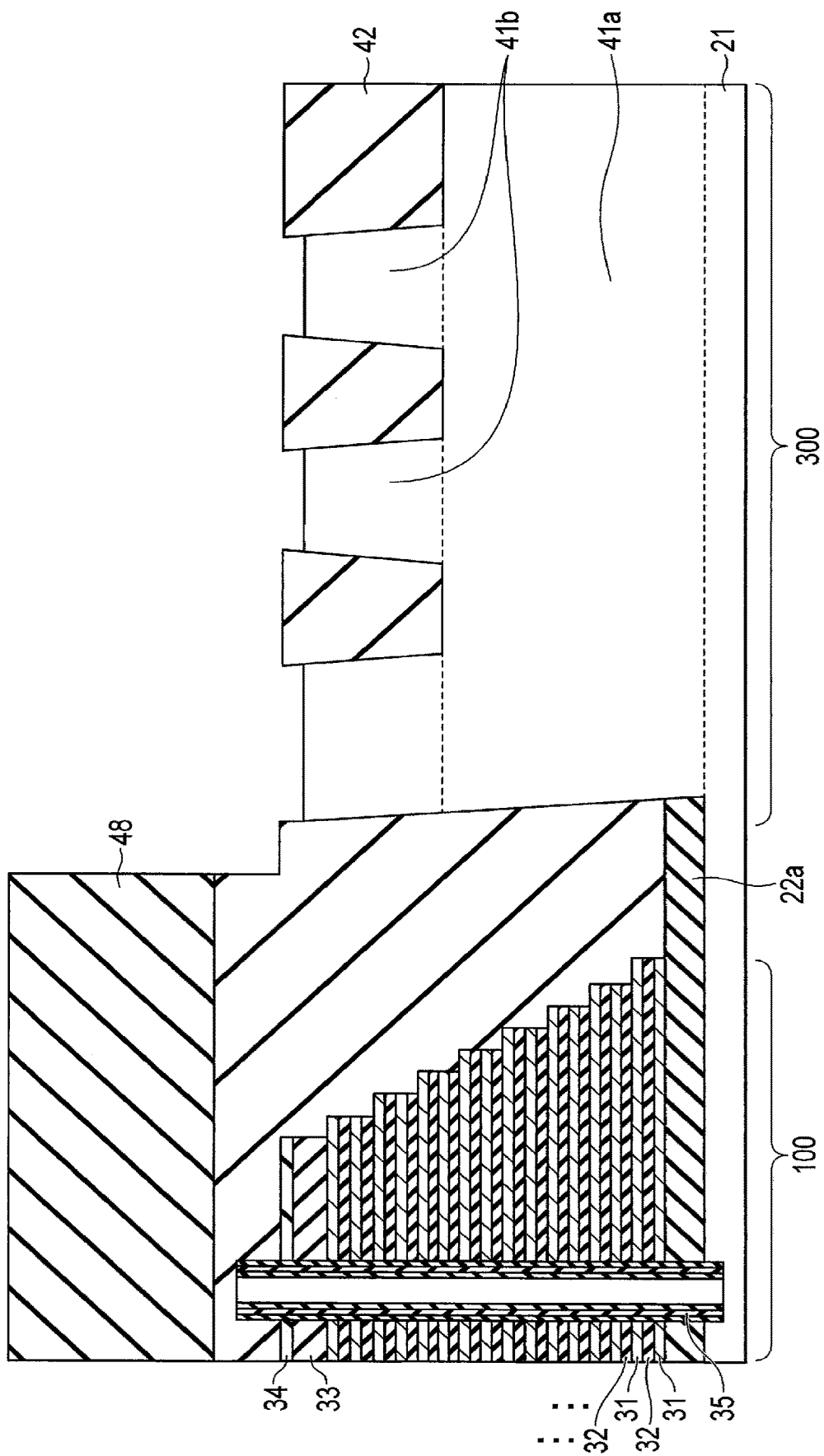

Next, as illustrated in FIG. 27, a hard mask 48 is formed, and then the hard mask 48 is patterned by lithography and etching. By patterning, a portion of the hard mask 48 in the peripheral circuitry region 300 is removed so as to expose the interlayer insulator 42 in the peripheral circuitry region 300. Thereafter, etching with the hard mask 48 is performed to remove the exposed portion of the interlayer insulator 42, thereby exposing the top surfaces of the semiconductors 41b.

After the hard mask 48 is removed, the transistors 51 are formed on the top surfaces of the semiconductors 41b, and the contacts CC or the like are formed, as illustrated in FIG. 20. Finally, the semiconductor storage device 1 as illustrated in FIG. 20 can be produced.

The process that includes the step of etching the semiconductor 41c after the step of constructing the memory cell region 100 as shown in FIG. 16 has been described above. However, the step of etching the semiconductor 41c may be performed before the step of constructing the memory cell region 100 of FIG. 16. Furthermore, an example of forming the semiconductor 41c by vapor phase growth of the semiconductor substrate 21 has been described. However, the semiconductor 41c may be formed by crystal growth in an amorphous silicon film through annealing as in FIGS. 11 to 13.

[Effects]

According to the second embodiment, the transistors 51 are formed above the semiconductors 41a and 41b that are provided on the top surface of the semiconductor substrate 21, in a manner similar to the first embodiment. Furthermore, according to the second embodiment, the transistors 51 are prepared in the peripheral circuitry region 300 after the memory cell array 11 is prepared in the memory cell region 100 in a manner similar to the first embodiment. In addition, according to the second embodiment, the side surface of the semiconductor 41a closer to the memory cell region 100 is formed along the inner wall of the patterned interlayer insulator 42 in a manner similar to the first embodiment. As a result, the semiconductor storage device 1 according to the second embodiment can produce similar effects as in the first embodiment.

Third Embodiment

A semiconductor storage device according to the third embodiment will be discussed below. The entire configuration of the semiconductor storage device according to the third embodiment may be the same as the configuration according to the first embodiment as illustrated in FIG. 1. Furthermore, the circuitry configuration of the memory cell array in the semiconductor storage device according to the third embodiment may be the same as the circuitry configuration according to the first embodiment as illustrated in FIG. 2.

Figure 28:
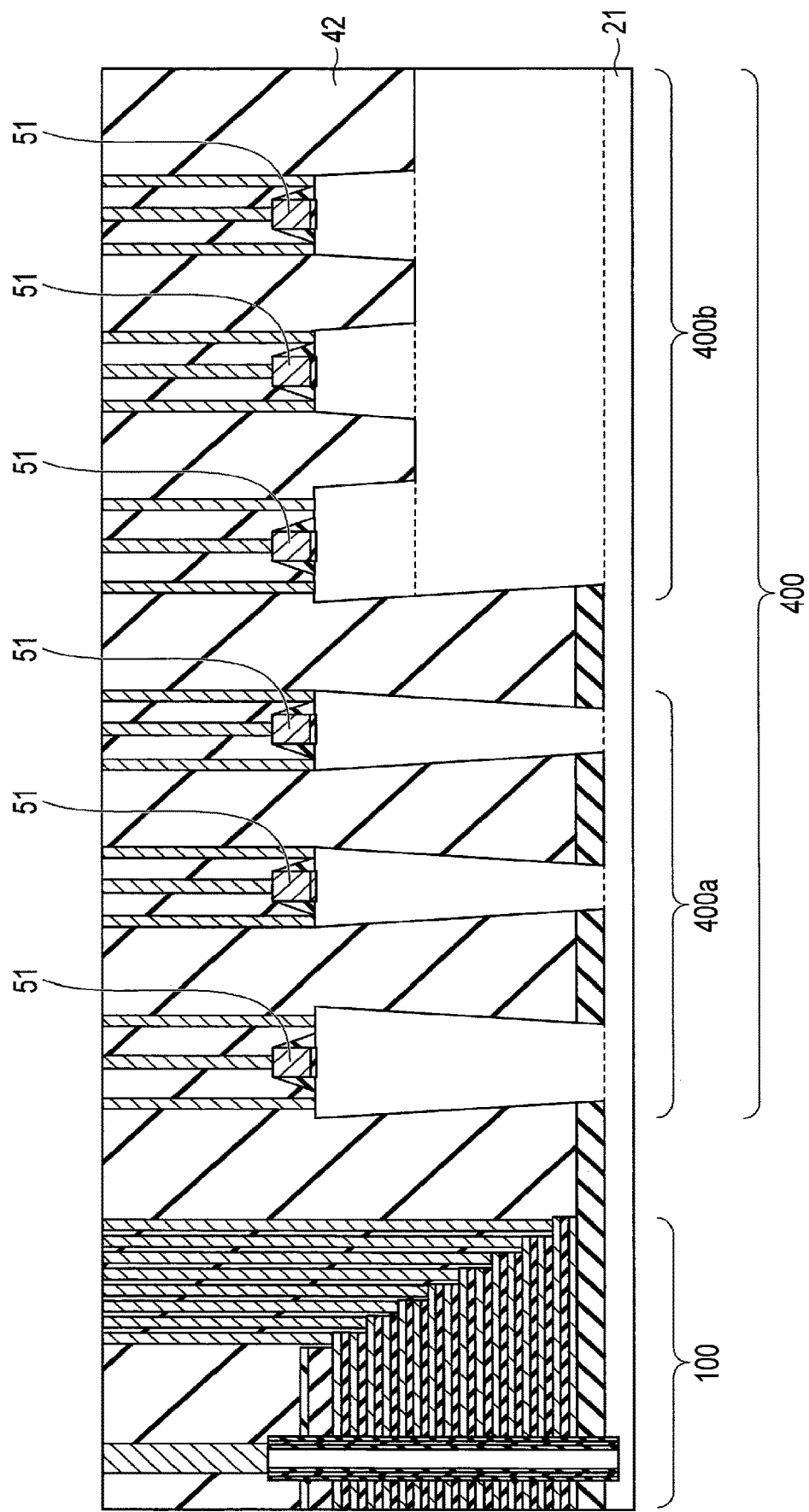
FIG. 28 is a cross-sectional view showing an example cross-sectional structure of a semiconductor storage device according to a third embodiment.

FIG. 28 is a cross-sectional view showing an example cross-sectional structure of the semiconductor storage device 1 according to the third embodiment. As illustrated in FIG. 28, the semiconductor storage device 1 according to the third embodiment includes the memory cell region 100 and a peripheral circuitry region 400. The memory cell region 100 has the same structure as the memory cell region 100 of FIG. 3 according to the first embodiment. The peripheral circuitry region 400 includes a first peripheral circuitry region 400a and a second peripheral circuitry region 400b. The first peripheral circuitry region 400a has the same structure as the peripheral circuitry region 200 of FIG. 3 according to the first embodiment, while the second peripheral circuitry region 400b has the same structure as the peripheral circuitry region 300 of FIG. 20 according to the second embodiment. The structure of the peripheral circuitry region 400 is illustrated in FIG. 28 merely as an example. The peripheral circuitry region 400 may be configured to have the first peripheral circuitry region 400a and the second peripheral circuitry region 400b in any regions of the peripheral circuitry region 400.

To produce the semiconductor storage device 1 according to the third embodiment, the steps of FIGS. 4 to 10 are performed first. However, in the process of forming the hard mask 43 of FIG. 7, the hard mask 43 in the first peripheral circuitry region 400a is patterned, for example, by lithography and etching so as to obtain the same pattern as in FIG. 7. On the other hand, with regard to the hard mask 43 in the second peripheral circuitry region 400b, the patterning of the hard mask 43 is performed so as to remove a portion of the hard mask 43 in the second peripheral circuitry region 400b as in FIG. 21. The top surface of the interlayer insulator 42 will be thereby exposed in the entire second peripheral circuitry region 400b. As a result, in the process of etching the interlayer insulator 42 in FIGS. 9 and 10, the etching reaches the semiconductor substrate 21 in the first peripheral circuitry region 400a, forming a pattern similar to the pattern of FIG. 10, while, in the second peripheral circuitry region 400b, the etching reaches the semiconductor substrate 21 in the entire second peripheral circuitry region 400b as in FIG. 21.

Next, vapor phase epitaxy is performed on the semiconductor substrate 21 for epitaxial growth along the inner walls of the interlayer insulator 42 with the same process as in FIGS. 18 and 22 so that semiconductors can be formed upward from the top surface of the semiconductor substrate 21. Here, by controlling the conditions for the epitaxial growth as explained with reference to FIG. 18, the formation of any facet on the side surfaces of the semiconductors can be suppressed. The epitaxial growth may be continued until it exceeds the height of the interlayer insulator 42. Thereafter, etching is performed to remove the portions of the semiconductors higher than the interlayer insulator 42.

Next, the process of FIGS. 15 to 17 and the process of FIGS. 23 to 27 are performed in parallel. Thereafter, the transistors 51 are formed on the top surfaces of the semiconductors, and the contacts CC or the like are formed as illustrated in FIGS. 3 and 20, as a result of which the semiconductor storage device 1 is completed as illustrated in FIG. 28.

The process that includes the step of etching the semiconductor in the second peripheral circuitry region 400b after the step of constructing the memory cell region 100 as shown in FIG. 16 has been described above. However, the step of etching the semiconductor in the second peripheral circuitry region 400b may be performed before the step of constructing the memory cell region 100 of FIG. 16. In addition, an example of forming the semiconductors by vapor phase growth of the semiconductor substrate 21 has been described. However, the semiconductors may be formed by crystal growth in the amorphous silicon film through annealing, as explained with reference to FIGS. 11 to 13.

According to the third embodiment, the transistors 51 are formed above the semiconductors provided on the top surface of the semiconductor substrate 21, in a manner similar to the first embodiment. Furthermore, according to the third embodiment, the transistors 51 are prepared in the peripheral circuitry region 400 after the memory cell array 11 is prepared in the memory cell region 100 in a manner similar to the first embodiment. In addition, according to the third embodiment, the side surface of the semiconductor closer to the memory cell region 100 is formed along the inner wall of the patterned interlayer insulator 42 in a manner similar to the first embodiment. As a result, the semiconductor storage device 1 according to the third embodiment produces similar effects as in the first embodiment.

Fourth Embodiment

A semiconductor storage device according to the fourth embodiment will be discussed below. The entire configuration of the semiconductor storage device according to the fourth embodiment may be the same as the configuration according to the first embodiment as illustrated in FIG. 1. Furthermore, the circuitry configuration of the memory cell array in the semiconductor storage device according to the fourth embodiment may be the same as the circuitry configuration according to the first embodiment as illustrated in FIG. 2.

Figure 29:
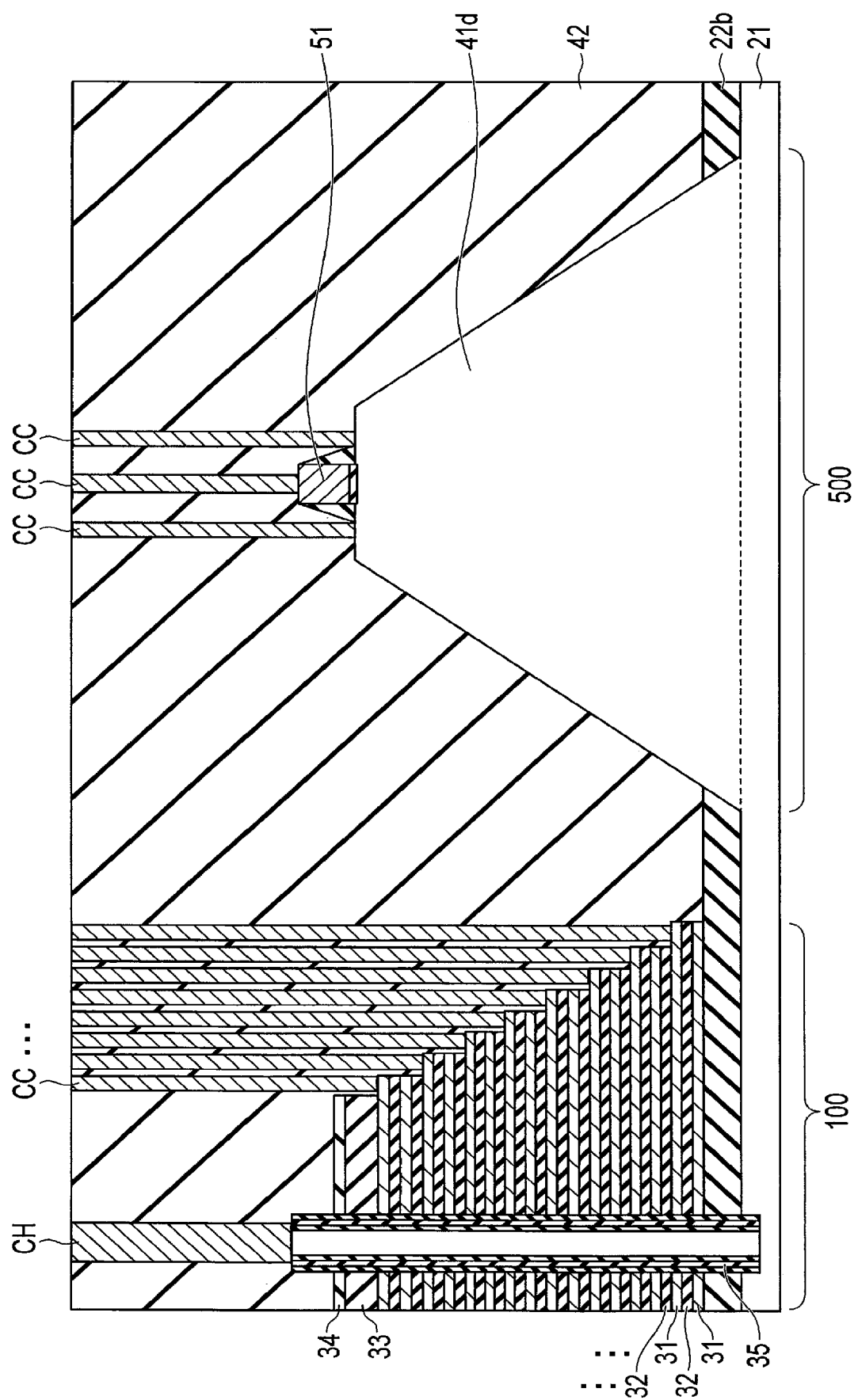
FIG. 29 is a cross-sectional view showing an example cross-sectional structure of a semiconductor storage device according to a fourth embodiment.

FIG. 29 is a cross-sectional view showing an example cross-sectional structure of the semiconductor storage device 1 according to the fourth embodiment. As illustrated in FIG. 29, the semiconductor storage device 1 according to the fourth embodiment includes the memory cell region 100 and a peripheral circuitry region 500. The memory cell region 100 has the same structure as the memory cell region 100 of FIG. 3 according to the first embodiment. The peripheral circuitry region 500 is different from the peripheral circuitry region 200 of FIG. 3 according to the first embodiment in the shape of the semiconductor formed on the top surface of the semiconductor substrate 21.

An example of the semiconductor storage device 1 according to the fourth embodiment as illustrated in FIG. 29 will be explained, focusing mainly on the shape of the semiconductor 41d on the top surface of the semiconductor substrate 21 in the peripheral circuitry region 500.

As illustrated in FIG. 29, the semiconductor storage device 1 includes the semiconductor substrate 21, on the top surface of which a protective film 22b is provided. The protective film 22b may be formed of silicon nitride SiN or carbon-doped silicon oxide SiCO. Here, a semiconductor 41d is formed through a portion of the protective film 22b (first region). The semiconductor 41d may extend along the laminating direction and reach the semiconductor substrate 21. A side surface of the semiconductor 41d has a facet, the angle of which is based on the crystal structure of the semiconductor substrate 21. In the same manner as in the first embodiment, the position of the topmost surface of the semiconductor 41d may be determined based on the position of any portion of the laminated body in the memory cell region 100 in the laminating direction. A transistor 51 is arranged on the semiconductor 41d. In FIG. 29, the transistor 51 is provided on the top surface of the semiconductor 41d. However, the transistor 51 may be provided at any position above the semiconductor 41d with any layer interposed in-between. In the same manner as in the first embodiment, the position of the transistor 51 in the laminating direction may be based on the position of any portion of the laminated body in the laminating direction in the memory cell region 100.

In the example of FIG. 29, a single transistor 51 is arranged on the top surface of the semiconductor 41d. However, a plurality of transistors 51 may be arranged on the top surface of the semiconductor 41d. If this is the case, the semiconductor 41d may include the first semiconductor portion and the second semiconductor portion, where the first semiconductor portion is positioned on the lower side of the semiconductor 41d and has a facet, while the second semiconductor portion is positioned on the top surface of the first semiconductor portion and has a length of the first direction increasing toward the bottom as described with reference to FIG. 20.

In the production of the semiconductor storage device 1 according to the fourth embodiment, the steps of FIGS. 4 to 10 are performed first. In the formation of the hard mask 43 of FIG. 7, the hard mask 43 is patterned, for example, by lithography and etching to remove a portion of the hard mask 43 in the peripheral circuitry region 500 so as to expose the top surface of the interlayer insulator 42 in the entire peripheral circuitry region 500. In this manner, the etching of the interlayer insulator 42 in FIGS. 9 and 10 reaches the semiconductor substrate 21 in the entire peripheral circuitry region 500.

Next, vapor phase epitaxy is performed on the semiconductor substrate 21 in the entire peripheral circuitry region 500 for epitaxial growth so that the semiconductor 41d can be formed in the upward direction from the top surface of the semiconductor substrate 21. In general, a side surface of the semiconductor 41d formed through the epitaxial growth has a facet, the angle of which is based on the crystal structure of the semiconductor substrate 21. When forming the semiconductor 41d, the epitaxial growth may be continued until it reaches a certain position in the laminating direction, and the top surface of the semiconductor 41d may be planarized by CMP or the like.

After this epitaxial growth, the processes of FIGS. 15 to 17 may be adopted to produce the semiconductor storage device 1 as illustrated in FIG. 29.

According to the fourth embodiment, the transistor 51 is formed above the semiconductor 41d provided on the top surface of the semiconductor substrate 21, in a manner similar to the first embodiment. Furthermore, according to the fourth embodiment, the transistor 51 is prepared in the peripheral circuitry region 500 after the memory cell array 11 is prepared in the memory cell region 100 in a manner similar to the first embodiment. As a result, effects that are similar to the effects obtained from the structure and process according to the first embodiment can be produced in the fourth embodiment.

Other Embodiments

The term "coupling" used throughout the specification refers to electrical coupling. This term may include coupling by way of another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate including a first surface;
a first semiconductor layer provided on a first region of the first surface of the semiconductor substrate, the first semiconductor layer including a second surface opposite of and parallel to the first surface of the semiconductor substrate;
a first transistor provided on the second surface of the first semiconductor layer;
a second semiconductor layer provided on a second region of the first surface of the semiconductor substrate, the second semiconductor layer including a third surface opposite of and parallel to the first surface of the semiconductor substrate;
a second transistor provided on the third surface of the second semiconductor layer;
a stacked body provided on a third region of the first surface of the semiconductor substrate, the stacked body including a plurality of conductors that are stacked one above the other in a first direction and a plurality of memory pillars extending in the first direction;
a first insulator provided between the first semiconductor layer and the second semiconductor layer;
a second insulator provided between the first semiconductor layer and the stacked body; and
a third insulator provided between the second semiconductor layer and the stacked body, wherein
the first semiconductor layer has a length of a lower portion of the first semiconductor layer in a second direction that is smaller than a length of the second surface of the first semiconductor layer in the second direction,
the lower portion is closer to the semiconductor substrate than the second surface, and
the second direction is parallel to the first surface of the semiconductor substrate.
2. The semiconductor memory device according to claim 1, wherein
the length of the second surface of the first semiconductor layer in the second direction is greater than a length of a lowermost surface of the first semiconductor layer in the second direction.
3. The semiconductor memory device according to claim 1, wherein
a length of the first semiconductor layer in the second direction decreases toward a bottom of the first semiconductor layer.
4. The semiconductor memory device according to claim 1, wherein
a side surface of the first semiconductor layer does not have a facet.
5. The semiconductor memory device according to claim 1, wherein
the semiconductor substrate is monocrystalline, and the first semiconductor layer is polycrystalline.
6. The semiconductor memory device according to claim 1, wherein
the second surface of the first semiconductor layer is above a topmost surface of the semiconductor substrate.

7. The semiconductor memory device according to claim 1, wherein
the second surface of the first semiconductor layer is above a midpoint of the stacked body in the first direction.

8. The semiconductor memory device according to claim 1, wherein
the second surface of the first semiconductor layer is at a same level in the first direction as a topmost surface of the stacked body.

9. The semiconductor memory device according to claim 1, wherein
each of the plurality of memory pillars extends through the plurality of conductors and includes a third semiconductor layer that reaches the semiconductor substrate.

10. The semiconductor memory device according to claim 1, wherein
the semiconductor memory device is a NAND flash memory.

* * * * *